(12) United States Patent
Ohshima et al.

(10) Patent No.: US 12,525,576 B2
(45) Date of Patent: Jan. 13, 2026

(54) SEMICONDUCTOR DEVICE AND ELECTRONIC DEVICE

(71) Applicant: Semiconductor Energy Laboratory Co., Ltd., Atsugi (JP)

(72) Inventors: Kazuaki Ohshima, Atsugi (JP); Hitoshi Kunitake, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 707 days.

(21) Appl. No.: 17/797,233

(22) PCT Filed: Mar. 1, 2021

(86) PCT No.: PCT/IB2021/051671
§ 371 (c)(1),
(2) Date: Aug. 3, 2022

(87) PCT Pub. No.: WO2021/181192
PCT Pub. Date: Sep. 16, 2021

(65) Prior Publication Data
US 2023/0067352 A1  Mar. 2, 2023

(30) Foreign Application Priority Data

Mar. 13, 2020 (JP) .................................. 2020-044668

(51) Int. Cl.
*H01L 25/065* (2023.01)
*H01L 23/538* (2006.01)
(Continued)

(52) U.S. Cl.
CPC ...... *H01L 25/0657* (2013.01); *H01L 23/5386* (2013.01); *H03K 19/094* (2013.01);
(Continued)

(58) Field of Classification Search
CPC ............. H01L 25/0657; H01L 23/5386; H01L 21/568; H01L 23/3128; H01L 2225/06513;
(Continued)

(56) References Cited

U.S. PATENT DOCUMENTS 8,916,976 B2  12/2014  Tago et al.
9,130,520 B2   9/2015  Mitsuishi et al.
(Continued)

FOREIGN PATENT DOCUMENTS

CN  101276809 A  10/2008
CN  102254897 A  11/2011
(Continued)

OTHER PUBLICATIONS

International Search Report (Application No. PCT/IB2021/051671) Dated Jun. 8, 2021.
(Continued)

*Primary Examiner* — Thanh Y. Tran
(74) *Attorney, Agent, or Firm* — Eric J. Robinson; Robinson Intellectual Property Law Office, P.C.

(57) ABSTRACT

A semiconductor device being capable of high-speed data transmission and having a reduced circuit area is provided. The semiconductor device includes a semiconductor chip, an external terminal, and a layer including two facing surfaces. The semiconductor chip is provided on one surface side of the layer, and the external terminal is provided on the other surface side of the layer at least in a region not overlapping with the semiconductor chip. The semiconductor chip includes a first circuit including a first transistor, and the layer includes a second circuit including a second transistor. The first circuit is electrically connected to the second circuit, and the second circuit is electrically connected to the external terminal. The second transistor (Continued)

includes a metal oxide in a channel formation region. Note that the second circuit may be a CML circuit. In addition, an insulator may be provided above the one surface of the layer and on a side surface of the semiconductor chip.

9 Claims, 15 Drawing Sheets

(51) Int. Cl.
    *H03K 19/094*     (2006.01)
    *H10D 30/67*     (2025.01)
    *H10D 86/40*     (2025.01)
    *H10D 86/60*     (2025.01)

(52) U.S. Cl.
    CPC ....... *H10D 30/6755* (2025.01); *H10D 86/441* (2025.01); *H10D 86/60* (2025.01)

(58) Field of Classification Search
    CPC ........ H01L 2225/06586; H03K 19/094; H10D 86/441; H10D 86/60
    See application file for complete search history.

(56) References Cited

U.S. PATENT DOCUMENTS

| | | |
|---|---|---|
| 9,396,998 B2 | 7/2016 | Kurita et al. |
| 9,911,756 B2 | 3/2018 | Yamazaki et al. |
| 9,984,979 B2 | 5/2018 | Park et al. |
| 10,199,337 B2 | 2/2019 | Park et al. |
| 10,223,960 B2 | 3/2019 | Inoue et al. |
| 10,256,200 B2 | 4/2019 | Park et al. |
| 10,262,949 B2 | 4/2019 | Park et al. |
| 10,522,471 B2 | 12/2019 | Suk et al. |
| 10,964,643 B2 | 3/2021 | Suk et al. |
| 2008/0237883 A1 | 10/2008 | Tago et al. |
| 2011/0285005 A1 | 11/2011 | Lin et al. |
| 2014/0167041 A1* | 6/2014 | Yamazaki ............ H10D 86/423 257/43 |
| 2015/0262877 A1 | 9/2015 | Kurita et al. |
| 2018/0061307 A1 | 3/2018 | Inoue et al. |
| 2021/0074709 A1* | 3/2021 | Liu ........................ H10B 12/09 |
| 2021/0167095 A1 | 6/2021 | Ishizu et al. |
| 2022/0216830 A1 | 7/2022 | Ohshima et al. |

FOREIGN PATENT DOCUMENTS

| | | |
|---|---|---|
| CN | 104916624 A | 9/2015 |
| CN | 109390326 A | 2/2019 |
| CN | 109565277 A | 4/2019 |
| JP | 2008-251912 A | 10/2008 |
| JP | 2011-139396 A | 7/2011 |
| JP | 2014-050087 A | 3/2014 |
| JP | 2015-002408 A | 1/2015 |
| JP | 2015-188052 A | 10/2015 |
| JP | 2016-213466 A | 12/2016 |
| JP | 2018-038038 A | 3/2018 |
| JP | 2019-036723 A | 3/2019 |
| KR | 2019-0039726 A | 4/2019 |
| TW | 201535592 | 9/2015 |
| TW | 201826697 | 7/2018 |
| WO | WO-2018/042288 | 3/2018 |
| WO | WO-2019/202431 | 10/2019 |
| WO | WO-2021/156700 | 8/2021 |
| WO | WO-2021/165799 | 8/2021 |

OTHER PUBLICATIONS

Written Opinion (Application No. PCT/IB2021/051671) Dated Jun. 8, 2021.

* cited by examiner

FIG. 13A
|  | Intermediate state New crystalline phase |  |
|---|---|---|
| Amorphous | Crystalline | Crystal |
| • completely amorphous | • CAAC<br>• nc<br>• CAC<br><br>excluding single crystal and poly crystal | • single crystal<br>• poly crystal |
FIG. 13B
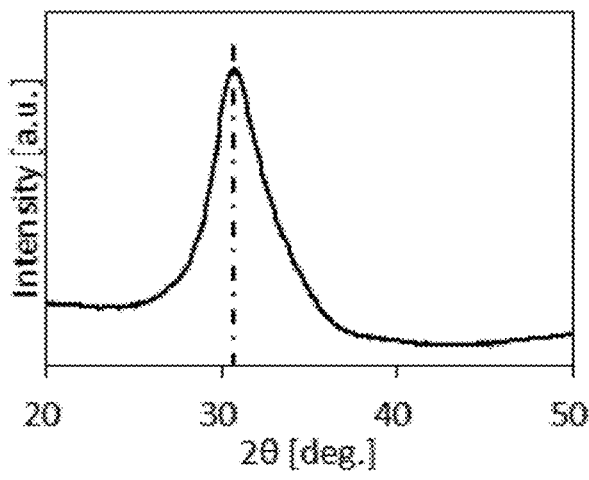
FIG. 13C
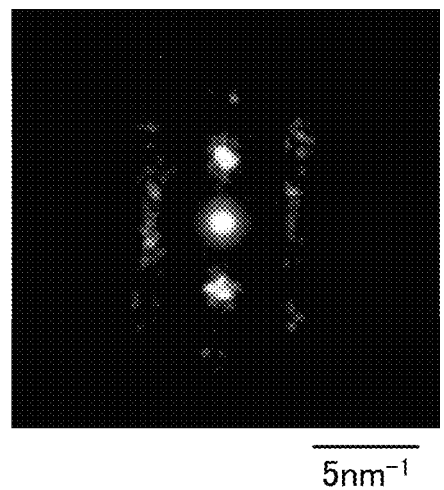

SEMICONDUCTOR DEVICE AND ELECTRONIC DEVICE

TECHNICAL FIELD

One embodiment of the present invention relates to a semiconductor device and an electronic device.

Note that one embodiment of the present invention is not limited to the above technical field. The technical field of the invention disclosed in this specification and the like relates to an object, an operation method, or a manufacturing method. Another embodiment of the present invention relates to a process, a machine, manufacture, or a composition of matter. Therefore, specific examples of the technical field of one embodiment of the present invention disclosed in this specification include a semiconductor device, a display apparatus, a liquid crystal display apparatus, a light-emitting apparatus, a power storage device, an imaging device, a memory device, a signal processing device, a sensor, a processor, an electronic device, a system, a driving method thereof, a manufacturing method thereof, and a testing method thereof.

BACKGROUND ART

Recent electronic devices such as personal computers and display apparatuses process an increasing amount of data. This is probably due to increasing processing capability of a processor or the like, increasing memory capacity of a memory device or the like, and increasing resolution of a display apparatus, for example.

The increasing processing capability and the increasing memory capacity of a memory device accordingly require higher-speed data transmission. For example, even when the processing capability of a processor is increased, the total processing time might be long if the amount of transmitted data is small. In addition, for example, in the case where a memory device processes a large amount of data in writing operation or reading operation, it might take a long time to transmit data input to and output from the memory device. Patent Document 1 and Patent Document 2 each disclose a structure of a circuit that employs a CML (current mode logic) circuit and is capable of high-speed data transmission.

REFERENCE

Patent Documents

[Patent Document 1] Japanese Published Patent Application No. 2015-2408
[Patent Document 2] Japanese Published Patent Application No. 2014-50087

SUMMARY OF THE INVENTION

Problems to be Solved by the Invention

A CML circuit can be formed using a bipolar transistor or a MOS transistor, for example. However, for example, it is difficult to form the CML circuit that uses a bipolar transistor over the same substrate as a circuit that uses a transistor other than a bipolar transistor. Furthermore, for example, it is difficult to form the CML circuit that uses a MOS transistor over the same substrate as a circuit that uses a transistor other than a MOS transistor.

Thus, in the case where the CML circuit and a different circuit are formed using different transistors, the CML circuit and the different circuit need to be formed over different substrates. For example, when the CML circuit and the different circuit are mounted on one printed circuit board, the area of the printed circuit board increases and thus the manufacturing cost of a semiconductor device including the CML circuit and the different circuit might also increase.

Even when the CML circuit and the different circuit can be formed over the same substrate (e.g., a semiconductor wafer) using the same transistors, the circuit area is sometimes large depending on the circuit scale. In this case, the area required for forming the circuit over the substrate increases with an increasing circuit area, which might increase the manufacturing cost of the semiconductor device including the CML circuit and the different circuit.

One object of one embodiment of the present invention is to provide a semiconductor device capable of high-speed data transmission. Another object of one embodiment of the present invention is to provide a semiconductor device with a reduced circuit area. Another object of one embodiment of the present invention is to provide a semiconductor device with reduced manufacturing cost. Another object of one embodiment of the present invention is to provide a novel semiconductor device.

Note that the objects of one embodiment of the present invention are not limited to the objects listed above. The objects listed above do not preclude the existence of other objects. The other objects are objects that are not described in this section and will be described below. The objects that are not described in this section are derived from the description of the specification, the drawings, and the like and can be extracted as appropriate from the description by those skilled in the art. Note that one embodiment of the present invention is to achieve at least one of the objects listed above and the other objects. Note that one embodiment of the present invention does not necessarily achieve all the objects listed above and the other objects.

Means for Solving the Problems (1)
One embodiment of the present invention is a semiconductor device including a semiconductor chip, an external terminal, and a layer including two surfaces. The semiconductor chip is provided on one surface side of the layer. The external terminal is provided on the other surface side of the layer at least in a region not overlapping with the semiconductor chip. The semiconductor chip includes a first circuit including a first transistor. The layer includes a second circuit including a second transistor. The first circuit is electrically connected to the second circuit. The second circuit is electrically connected to the external terminal. The second transistor includes a metal oxide in a channel formation region.

(2)
In one embodiment of the present invention according to the above (1), the second circuit may include a CML circuit.

(3)
In one embodiment of the present invention according to the above (1) or (2), an insulator may be provided above the one surface of the layer and on a side surface of the semiconductor chip.

(4)
In one embodiment of the present invention according to any one of the above (1) to (3), the semiconductor chip may include a connection terminal and the first circuit and the second circuit may be electrically connected to each other through the connection terminal.

(5)

In one embodiment of the present invention according to any one of the above (1) to (4), the metal oxide contains indium, an element M (M is one or more elements selected from aluminum, gallium, yttrium, tin, and titanium), and zinc.

(6)

Another embodiment of the present invention is an electronic device including the semiconductor device according to any one of the above (1) to (5) and a housing.

Note that in this specification and the like, a semiconductor device refers to a device that utilizes semiconductor characteristics, and means a circuit including a semiconductor element (a transistor, a diode, a photodiode, or the like), a device including the circuit, and the like. The semiconductor device also means devices that can function by utilizing semiconductor characteristics. For example, an integrated circuit, a chip including an integrated circuit, an electronic component including a chip in a package, and the like are examples of the semiconductor device. Moreover, a memory device, a display device, a light-emitting device, a lighting device, an electronic device, and the like themselves are semiconductor devices, or include semiconductor devices in some cases.

In the case where there is a description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, at least one element that enables electrical connection between X and Y (e.g., a switch, a transistor, a capacitor, an inductor, a resistor, a diode, a display device, a light-emitting device, or a load) can be connected between X and Y. Note that a switch has a function of being controlled to be turned on or off. That is, the switch has a function of being in a conduction state (on state) or a non-conduction state (off state) to control whether a current flows or not.

For example, in the case where X and Y are functionally connected, one or more circuits that allow functional connection between X and Y (e.g., a logic circuit (an inverter, a NAND circuit, a NOR circuit, or the like); a signal converter circuit (a digital-analog converter circuit, an analog-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y. For instance, even if another circuit is provided between X and Y, X and Y are regarded as being functionally connected when a signal output from X is transmitted to Y.

Note that an explicit description, X and Y are electrically connected, includes the case where X and Y are electrically connected (i.e., the case where X and Y are connected through another element or another circuit) and the case where X and Y are directly connected (i.e., the case where X and Y are connected without through another element or another circuit).

It can be expressed as, for example, "X, Y, and a source (or a first terminal or the like) and a drain (or a second terminal or the like) of a transistor are electrically connected to each other, and X, the source (or the first terminal or the like) of the transistor, the drain (or the second terminal or the like) of the transistor, and Y are electrically connected in this order". Alternatively, it can be expressed as "a source (or a first terminal or the like) of a transistor is electrically connected to X; a drain (or a second terminal or the like) of the transistor is electrically connected to Y; and X, the source (or the first terminal or the like) of the transistor, the drain (or the second terminal or the like) of the transistor, and Y are electrically connected in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit structure is defined by an expression similar to the above examples, a source (or a first terminal or the like) and a drain (or a second terminal or the like) of a transistor can be distinguished from each other to specify the technical scope. Note that the above expressions are examples, and there is no limitation on the expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both of the components, the function of a wiring and the function of an electrode. Thus, electrical connection in this specification includes, in its category, such a case where one conductive film has functions of a plurality of components.

In this specification and the like, a "resistor" can be, for example, a circuit element or a wiring having a resistance value higher than $0\Omega$. Therefore, in this specification and the like, a "resistor" sometimes includes a wiring having a resistance value, a transistor in which current flows between its source and drain, a diode, and a coil. Thus, the term "resistor" can be replaced with the terms "resistance", "load", "region having a resistance value", and the like; inversely, the terms "resistance", "load", and "region having a resistance value" can be replaced with the term "resistor" and the like. The resistance value can be, for example, preferably greater than or equal to 1 m$\Omega$ and less than or equal to 10$\Omega$, further preferably greater than or equal to 5 m$\Omega$ and less than or equal to 5$\Omega$, still further preferably greater than or equal to 10 m$\Omega$ and less than or equal to 1$\Omega$. As another example, the resistance value may be greater than or equal to 1$\Omega$ and less than or equal to $1\times10^9\Omega$.

In this specification and the like, a "capacitor" can be, for example, a circuit element having an electrostatic capacitance value higher than 0 F, a region of a wiring having an electrostatic capacitance value, parasitic capacitance, or gate capacitance of a transistor. Therefore, in this specification and the like, a "capacitor" sometimes includes not only a circuit element that has a pair of electrodes and a dielectric between the electrodes, but also parasitic capacitance generated between wirings, gate capacitance generated between a gate and one of a source and a drain of a transistor, and the like. The terms "capacitor", "parasitic capacitance", "gate capacitance", and the like can be replaced with the term "capacitance" and the like; inversely, the term "capacitance" can be replaced with the terms "capacitor", "parasitic capacitance", "gate capacitance", and the like. The term "pair of electrodes" of "capacitor" can be replaced with "pair of conductors", "pair of conductive regions", "pair of regions", and the like. Note that the electrostatic capacitance value can be greater than or equal to 0.05 fF and less than or equal to 10 pF, for example. As another example, the electrostatic capacitance value may be greater than or equal to 1 pF and less than or equal to 10 μF.

In this specification and the like, a transistor includes three terminals called a gate, a source, and a drain. The gate is a control terminal for controlling the conduction state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Therefore, the terms "source" and "drain" can be replaced with each other in this specification and the like. In this specification and the like, expressions "one of a source and a drain" (or a first electrode or a first terminal) and "the other of the source and the drain" (or a second electrode or a second terminal) are used in description of the connection relation of a transistor. Depending on the transistor structure, a transistor may include a back gate in addition to the above three terminals. In that case, in this specification and the like, one of the gate and the back gate of the transistor may be referred to as a first gate and the other of the gate and the back gate of the transistor may be referred to as a second gate. In some cases, the terms "gate" and "back gate" can be replaced with each other in one transistor. In the case where a transistor includes three or more gates, the gates may be referred to as a first gate, a second gate, and a third gate, for example, in this specification and the like.

In this specification and the like, a node can be referred to as a terminal, a wiring, an electrode, a conductive layer, a conductor, an impurity region, or the like depending on the circuit structure, the device structure, or the like. Furthermore, a terminal, a wiring, or the like can be referred to as a node.

In this specification and the like, "voltage" and "potential" can be replaced with each other as appropriate. "Voltage" refers to a potential difference from a reference potential, and when the reference potential is a ground potential, for example, "voltage" can be replaced with "potential". Note that the ground potential does not necessarily mean 0 V. Moreover, potentials are relative values, and a potential supplied to a wiring, a potential applied to a circuit and the like, and a potential output from a circuit and the like, for example, are changed with a change of the reference potential.

In this specification and the like, the terms "high-level potential" and "low-level potential" do not mean a particular potential. For example, in the case where two wirings are both described as "functioning as a wiring for supplying a high-level potential", the levels of the high-level potentials supplied from the wirings are not necessarily equal to each other. Similarly, in the case where two wirings are both described as "functioning as a wiring for supplying a low-level potential", the levels of the low-level potentials supplied from the wirings are not necessarily equal to each other.

"Current" means a charge transfer (electrical conduction); for example, the description "electrical conduction of positively charged particles is caused" can be rephrased as "electrical conduction of negatively charged particles is caused in the opposite direction". Therefore, unless otherwise specified, "current" in this specification and the like refers to a charge transfer (electrical conduction) accompanied by carrier movement. Examples of a carrier here include an electron, a hole, an anion, a cation, and a complex ion, and the type of carrier differs between current flow systems (e.g., a semiconductor, a metal, an electrolyte solution, and a vacuum). The "direction of current" in a wiring or the like refers to the direction in which a positive carrier moves, and the amount of current is expressed as a positive value. In other words, the direction in which a negative carrier moves is opposite to the direction of current, and the amount of current is expressed as a negative value. Thus, in the case where the polarity of current (or the direction of current) is not specified in this specification and the like, the description "current flows from element A to element B" can be rephrased as "current flows from element B to element A", for example. As another example, the description "current is input to element A" can be rephrased as "current is output from element A".

Ordinal numbers such as "first", "second", and "third" in this specification and the like are used in order to avoid confusion among components. Thus, the terms do not limit the number of components. Furthermore, the terms do not limit the order of components. For example, a "first" component in one embodiment in this specification and the like can be referred to as a "second" component in other embodiments or the scope of claims. As another example, a "first" component in one embodiment in this specification and the like can be omitted in other embodiments or the scope of claims.

In this specification and the like, the terms for describing positioning, such as "over" and "under", are sometimes used for convenience to describe the positional relation between components with reference to drawings. The positional relation between components is changed as appropriate in accordance with the direction from which each component is described. Thus, the positional relation is not limited to that described with a term in this specification and the like and can be described with another term as appropriate depending on the situation. For example, the expression "an insulator positioned over (on) a top surface of a conductor" can be replaced with the expression "an insulator positioned under (on) a bottom surface of a conductor" when the direction of a drawing showing these components is rotated by 180°.

Furthermore, the terms such as "over" and "under" do not necessarily mean that a component is placed directly over or directly under and in direct contact with another component. For example, the expression "electrode B over insulating layer A" does not necessarily mean that the electrode B is formed on and in direct contact with the insulating layer A, and does not exclude the case where another component is provided between the insulating layer A and the electrode B.

In this specification and the like, the terms such as "film" and "layer" can be interchanged with each other depending on the situation. For example, the term "conductive layer" can be changed into the term "conductive film" in some cases. Moreover, the term "insulating film" can be changed into the term "insulating layer" in some cases. Alternatively, the term "film", "layer", or the like is not used and can be interchanged with another term depending on the case or according to circumstances. For example, the term "conductive layer" or "conductive film" can be changed into the term "conductor" in some cases. Furthermore, for example, the term "insulating layer" or "insulating film" can be changed into the term "insulator" in some cases.

In this specification and the like, the terms "electrode," "wiring," and "terminal" do not functionally limit those components. For example, an "electrode" is used as part of a wiring in some cases, and vice versa. Furthermore, the terms "electrode" or "wiring" can also include the case where a plurality of "electrodes" or "wirings" are formed in an integrated manner. For example, a "terminal" is used as part of a "wiring" and/or an "electrode" in some cases, and vice versa. Furthermore, the term "terminal" can also include the case where a plurality of "electrodes", "wirings", "terminals", or the like are formed in an integrated manner. Therefore, for example, an "electrode" can be part of a "wiring" or a "terminal", and a "terminal" can be part of a "wiring" or an "electrode". Moreover, the term "electrode", "wiring", "terminal", or the like is sometimes replaced with the term "region", for example.

In this specification and the like, the terms "wiring", "signal line", "power supply line", and the like can be interchanged with each other depending on the case or according to circumstances. For example, the term "wiring" can be changed into the term "signal line" in some cases. As another example, the term "wiring" can be changed into the term "power supply line" in some cases. Conversely, the term "signal line", "power supply line", or the like can be changed into the term "wiring" in some cases. The term "power supply line" or the like can be changed into the term "signal line" or the like in some cases. Conversely, the term "signal line" or the like can be changed into the term "power supply line" or the like in some cases. The term "potential" that is applied to a wiring can be changed into the term "signal" or the like depending on the case or according to circumstances. Conversely, the term "signal" or the like can be changed into the term "potential" in some cases.

In this specification and the like, an impurity in a semiconductor refers to, for example, elements other than the main components of a semiconductor layer. For instance, an element with a concentration of lower than 0.1 atomic % is an impurity. When an impurity is contained, for example, the density of defect states in a semiconductor is increased, carrier mobility is decreased, or crystallinity is decreased in some cases. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specifically, there are hydrogen (contained also in water), lithium, sodium, silicon, boron, phosphorus, carbon, nitrogen, and the like, for example. Specifically, when the semiconductor is a silicon layer, examples of impurities that change the characteristics of the semiconductor include Group 1 elements except hydrogen, Group 2 elements, Group 13 elements, Group 15 elements, and oxygen.

In this specification and the like, a switch has a function of being in a conduction state (on state) or a non-conduction state (off state) to determine whether a current flows or not. Alternatively, a switch has a function of selecting and changing a current path. For example, an electrical switch or a mechanical switch can be used. That is, a switch can be any element capable of controlling current, and is not limited to a particular element.

Examples of an electrical switch include a transistor (e.g., a bipolar transistor and a MOS transistor), a diode (e.g., a PN diode, a PIN diode, a Schottky diode, a MIM (Metal Insulator Metal) diode, a MIS (Metal Insulator Semiconductor) diode, and a diode-connected transistor), and a logic circuit in which such elements are combined. Note that in the case of using a transistor as a switch, a "conduction state" of the transistor refers to a state where a source electrode and a drain electrode of the transistor can be regarded as being electrically short-circuited. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical system) technology. Such a switch includes an electrode that can be moved mechanically, and operates by controlling conduction and non-conduction with movement of the electrode.

In this specification, "parallel" indicates a state where two straight lines are placed at an angle greater than or equal to $-10°$ and less than or equal to $10°$. Thus, the case where the angle is greater than or equal to $-5°$ and less than or equal to $5°$ is also included. Moreover, "approximately parallel" or "substantially parallel" indicates a state where two straight lines are placed at an angle greater than or equal to $-30°$ and less than or equal to $30°$. In addition, "perpendicular" indicates a state where two straight lines are placed at an angle greater than or equal to $80°$ and less than or equal to $100°$. Thus, the case where the angle is greater than or equal to $85°$ and less than or equal to $95°$ is also included. Furthermore, "approximately perpendicular" or "substantially perpendicular" indicates a state where two straight lines are placed at an angle greater than or equal to $60°$ and less than or equal to $120°$.

Effect of the Invention

One embodiment of the present invention can provide a semiconductor device capable of high-speed data transmission. Another embodiment of the present invention can provide a semiconductor device with a reduced circuit area. Another embodiment of the present invention can provide a semiconductor device with reduced manufacturing cost. Another embodiment of the present invention can provide a novel semiconductor device.

Note that the effects of one embodiment of the present invention are not limited to the effects listed above. The effects listed above do not preclude the existence of other effects. The other effects are effects that are not described in this section and will be described below. The effects that are not described in this section are derived from the description of the specification, the drawings, or the like and can be extracted as appropriate from the description by those skilled in the art. Note that one embodiment of the present invention has at least one of the effects listed above and the other effects. Accordingly, one embodiment of the present invention does not have the effects listed above in some cases.

BRIEF DESCRIPTION OF THE DRAWINGS

FIG. 13A is a diagram showing classification of crystal structures of IGZO, FIG. 13B is a diagram showing an XRD spectrum of crystalline IGZO, and FIG. 13C is a diagram showing a nanobeam electron diffraction pattern of the crystalline IGZO.

MODE FOR CARRYING OUT THE INVENTION

Figure 1:
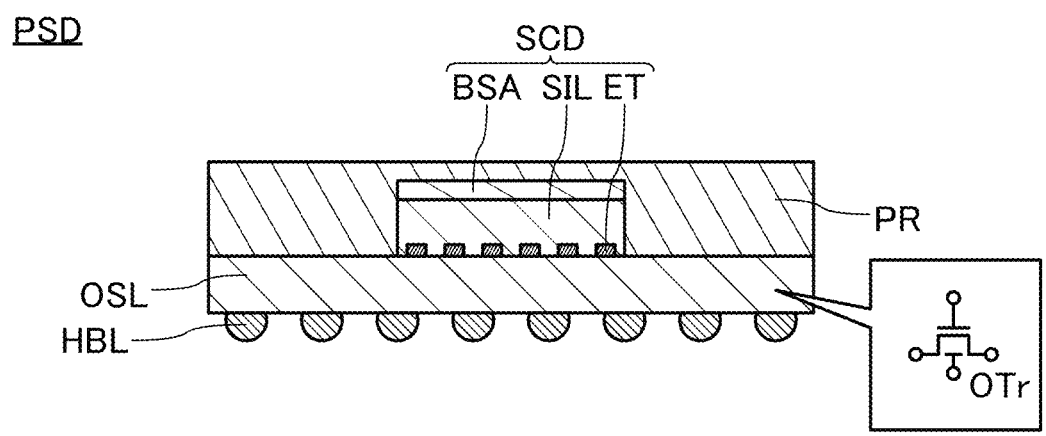
FIG. 1 is a schematic cross-sectional view illustrating a structure example of a semiconductor device.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor. In the case where an OS transistor is mentioned, the OS transistor can also be referred to as a transistor including a metal oxide or an oxide semiconductor.

In this specification and the like, a metal oxide containing nitrogen is also referred to as a metal oxide in some cases. A metal oxide containing nitrogen may be referred to as a metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate.

Note that a content (or part of the content) described in one embodiment can be applied to, combined with, or replaced with at least one of another content (or part of the content) in the embodiment and a content (or part of the content) described in one or a plurality of different embodiments.

Note that in each embodiment, content described in the embodiment is content described using a variety of diagrams or content described with text disclosed in the specification.

Note that by combining a diagram (or part thereof) described in one embodiment with at least one of another part of the diagram, a different diagram (or part thereof) described in the embodiment, and a diagram (or part thereof) described in one or a plurality of different embodiments, much more diagrams can be formed.

Embodiments described in this specification will be described with reference to the drawings. Note that the embodiments can be implemented in many different modes, and it will be readily appreciated by those skilled in the art that modes and details can be changed in various ways without departing from the spirit and scope thereof. Therefore, the present invention should not be construed as being limited to the description of the embodiments. Note that in the structures of the invention in the embodiments, the same portions or portions having similar functions are denoted by the same reference numerals in different drawings, and repeated description thereof is omitted in some cases. In perspective views and the like, illustration of some components is sometimes omitted for clarity of the drawings.

In this specification and the like, when a plurality of components are denoted by the same reference numerals, and in particular need to be distinguished from each other, an identification sign such as "_1", "[n]", or "[m,n]" is sometimes added to the reference numerals.

In the drawings in this specification, the size, the layer thickness, or the region is exaggerated for clarity in some cases. Therefore, they are not limited to the illustrated scale. The drawings are schematic views showing ideal examples, and embodiments of the present invention are not limited to shapes, values, or the like shown in the drawings. For example, variations in signal, voltage, or current due to noise, variations in signal, voltage, or current due to difference in timing, or the like can be included.

Embodiment 1

In this embodiment, a semiconductor device of one embodiment of the present invention will be described.

Structure Example of Semiconductor Device

FIG. 1 is a cross-sectional view illustrating an example of a semiconductor device having an FOWLP (Fan Out Wafer Level Package) structure. A semiconductor device PSD includes a die SCD, a layer OSL, an insulator PR, and a bump HBL, for example. The die SCD includes a substrate BSA, a layer SIL, and a connection terminal ET.

The die SCD can be a semiconductor chip cut out from a semiconductor wafer, which will be described later in Embodiment 4. In this embodiment, the layer SIL is formed over the substrate BSA in the die SCD. The layer SIL can include a switching circuit, a logic circuit, an analog circuit, or the like, for example. Note that a signal converter circuit, a potential level converter circuit, an amplifier circuit, or the like is sometimes included as the analog circuit, for example. In addition, the layer SIL may include a memory device, an arithmetic circuit, or the like.

The substrate BSA can be a semiconductor substrate containing silicon as a material, for example. When the substrate BSA is a semiconductor substrate containing silicon as a material, a transistor containing silicon in its channel formation region (hereinafter referred to as Si transistor) can be formed on the substrate BSA, so that the switching circuit, the logic circuit, the analog circuit, or the like included in the layer SIL can be formed using the Si transistor.

Alternatively, the substrate BSA may be a semiconductor substrate containing germanium as a material or a compound semiconductor substrate containing silicon carbide, silicon germanium, gallium arsenide, indium phosphide, zinc oxide, or gallium oxide as a material, for example. Alternatively, a semiconductor substrate in which an insulator region is included in the semiconductor substrate, for example, an SOI (Silicon On Insulator) substrate or the like may also be used as the substrate BSA.

Alternatively, an insulator substrate may also be used as the substrate BSA, for example. Examples of the insulator substrate include a glass substrate, a quartz substrate, a sapphire substrate, a stabilized zirconia substrate (e.g., an yttria-stabilized zirconia substrate), and a resin substrate. Alternatively, a conductor substrate may also be used as the substrate BSA, for example. Examples of the conductor substrate include a graphite substrate, a metal substrate, an alloy substrate, and a conductive resin substrate. Note that in the case where an insulator substrate or a conductor substrate is used as the substrate BSA, a channel formation region cannot be formed in the insulator substrate or the conductive substrate, unlike in a semiconductor substrate; thus, a transistor cannot be formed directly on the insulator substrate or the conductor substrate. Therefore, in order to form a transistor over the insulator substrate or the conductor substrate, a semiconductor film needs to be additionally provided above the insulator substrate or the conductor substrate.

The die SCD is provided such that the connection terminal ET is over and in contact with the layer OSL. The connection terminal ET functions as a terminal for electrically connecting a circuit included in the die SCD and a wiring included in the layer OSL.

The bump HBL is provided on a surface of the layer OSL opposite to the surface provided with the die SCD. In the layer OSL, a wiring for electrically connecting the circuit included in the die SCD and the bump HBL is provided. Thus, the layer OSL functions as a redistribution layer in the FOWLP.

Note that FIG. 1 illustrates a ball as an example of the bump HBL. The bump HBL can be formed using a solder. As described above, the semiconductor device PSD includes terminals forming a BGA (Ball Grid Array). Note that the terminals provided for the semiconductor device PSD is not limited to the BGA. For example, the semiconductor device PSD may include terminals forming an LGA (Land Grid Array), a PGA (Pin Grid Array), or the like instead of the BGA.

When the bump HBL is provided in a region of the layer OSL not overlapping with the die SCD, the connection terminal ET can be extended to the outside of the die SCD. Thus, the bump HBL is preferably provided at least in a region of the layer OSL not overlapping with the die SCD, and preferably provided also in a region of the layer OSL overlapping with the die SCD. When the bump HBL is provided in a region of the layer OSL not overlapping with the die SCD, a pitch width between the bumps HBL can be larger than a pitch width between the connection terminals ET of the die SCD.

A transistor OTr is also provided in the layer OSL. As the transistor OTr, an OS transistor can be used, for example. In addition, it is further preferable that a channel formation region of the OS transistor include an oxide containing at least one of indium, gallium, and zinc. Instead of the oxide, an oxide containing at least one of indium, an element M (as the element M, one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like can be given for example), and zinc may be used. It is further preferable that the OS transistor have a structure of a transistor described particularly in Embodiment 2.

Providing the transistor OTr in the layer OSL that is a redistribution layer enables a desired circuit to be formed in the redistribution layer. That is, the layer OSL may include a circuit including the transistor OTr, for example.

In the semiconductor device PSD in FIG. 1, the die SCD and the layer OSL are bonded together to be electrically connected to each other. Specifically, bonding is performed such that an electrical connection terminal included in the die SCD and an electrical connection terminal included in the layer OSL are in contact with each other. Examples of the electrical connection terminal here include a conductor and a wiring. A method for electrically connecting a circuit formed over the die SCD to the layer OSL that is the redistribution layer will be described later.

Over the die SCD and the layer OSL, the insulator PR is provided as a sealant. The insulator PR has a function of a protective layer for preventing electrostatic breakdown of the die SCD and a sealant for preventing entry of a component to the die SCD from the outside.

As the insulator PR, an organic resin layer of an epoxy-based resin or the like can be used, for example.

Figure 2A:
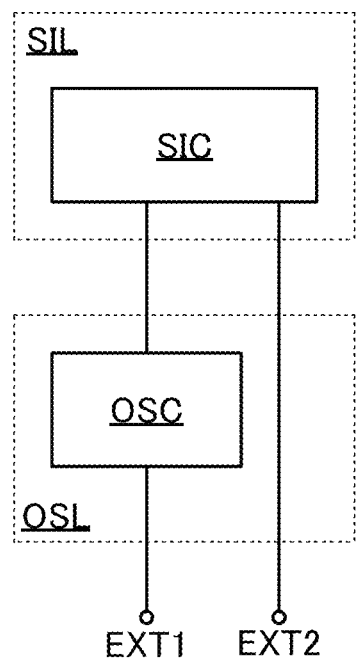
FIG. 2A and FIG. 2B are block diagrams illustrating structure examples of a semiconductor device.

Here, a block diagram in FIG. 2A illustrates, as a specific example, a structure example of a circuit included in the semiconductor device PSD in FIG. 1. In the semiconductor device PSD in FIG. 2A, the layer SIL includes a circuit SIC and the layer OSL includes a circuit OSC, for example. As the circuit SIC or the circuit OSC, a switching circuit, a logic circuit, an analog circuit, or the like can be included, for example. In the semiconductor device PSD in FIG. 2A, the circuit SIC is electrically connected to the circuit OSC and the circuit OSC is electrically connected to an external terminal EXT1, for example. The external terminal EXT1 here corresponds to the bump HBL illustrated in the semiconductor device PSD in FIG. 1, for example. As illustrated in FIG. 2A, the circuit SIC may be electrically connected to an external terminal EXT2 without through the circuit OSC. Like the external terminal EXT1, the external terminal EXT2 here corresponds to the bump HBL illustrated in the semiconductor device PSD in FIG. 1, for example.

In particular, in the semiconductor device PSD in FIG. 2A, a CML (Current Mode Logic) circuit may be included as the circuit OSC, for example. The CML circuit is a signal transmission circuit employing low voltage differential signaling utilizing a differential amplifier circuit, and achieves high-speed signal transmission. In addition, the CML circuit has a function of an output buffer circuit in high-speed data communication, and can stabilize the level of a signal output through the CML circuit.

Providing the CML circuit in the layer OSL can increase the speed of signal transmission from the circuit SIC included in the layer SIL to the outside of the semiconductor device PSD1 and/or signal transmission from the outside of the semiconductor device PSD1 to the circuit SIC included in the layer SIL.

Figure 2B:
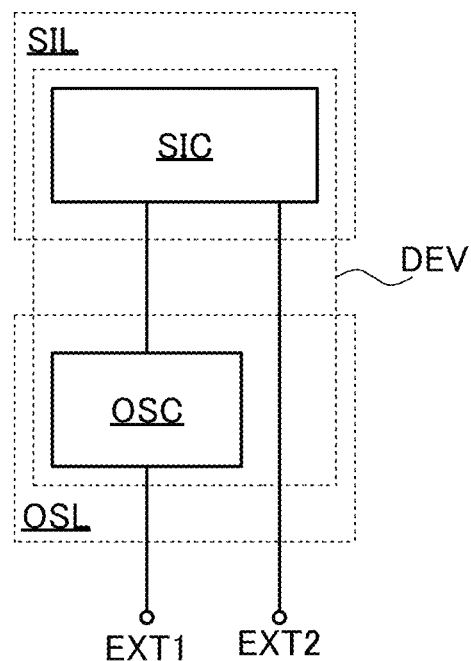

Note that the structure of the semiconductor device of one embodiment of the present invention is not limited to that of the semiconductor device PSD illustrated in FIG. 2A. The semiconductor device of one embodiment of the present invention may have a structure illustrated in a block diagram in FIG. 2B. The circuit structure of the semiconductor device PSD in FIG. 2B is similar to that of the semiconductor device PSD in FIG. 2A in that the layer SIL includes the circuit SIC and the layer OSL includes the circuit OSC, but different from the circuit structure of the semiconductor device PSD in FIG. 2A in that the circuit SIC and the circuit OSC form a circuit DEV. That is, the circuit OSC may be a partial circuit that can form the circuit DEV when combined with the circuit SIC included in the layer SIL. Note that the circuit DEV can be a memory device, an arithmetic circuit, or the like, for example. As illustrated in FIG. 2B, the circuit SIC may be electrically connected to the external terminal EXT2 without through the circuit OSC, as in the semiconductor device PSD in FIG. 2A.

Structure Example of CML Circuit

Here, structure examples of the CML circuit that can be provided in the circuit OSC will be described.
[Oscillator]

Figure 3A:
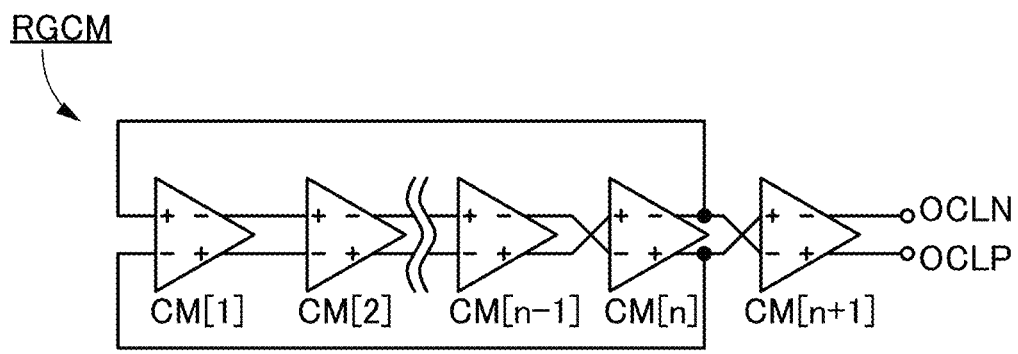
FIG. 3A to FIG. 3C are circuit diagrams illustrating structure examples of circuits included in a semiconductor device.

A circuit RGCM illustrated in FIG. 3A is a CML circuit functioning as an oscillator and includes a differential amplifier circuit CM[1] to a differential amplifier circuit CM[n+1] (here, n is an even number of four or more).

In addition, the circuit RGCM includes a terminal OCLN and a terminal OCLP. The terminal OCLP and the terminal OCLN each function as an output terminal of the circuit RGCM.

An inverting output terminal of the differential amplifier circuit CM[1] is electrically connected to a non-inverting input terminal of the differential amplifier circuit CM[2], and a non-inverting output terminal of the differential amplifier circuit CM[1] is electrically connected to an inverting input terminal of the differential amplifier circuit CM[2]. An inverting output terminal of the differential amplifier circuit CM[n−1] is electrically connected to an inverting input terminal of the differential amplifier circuit CM[n], and a non-inverting output terminal of the differential amplifier circuit CM[n−1] is electrically connected to a non-inverting input terminal of the differential amplifier circuit CM[2]. An inverting output terminal of the differential amplifier circuit CM[n] is electrically connected to an inverting input terminal of the differential amplifier circuit CM[n+1] and a non-inverting input terminal of the differential amplifier circuit CM1, and a non-inverting output terminal of the differential amplifier circuit CM[n] is electrically connected to a non-inverting input terminal of the differential amplifier circuit CM[n+1] and an inverting input terminal of the differential amplifier circuit CM[1]. An inverting input terminal of the differential amplifier circuit CM[n+1] is electrically connected to the terminal OCLN, and a non-inverting input terminal of the differential amplifier circuit CM[n+1] is electrically connected to the terminal OCLP.

That is, as illustrated in FIG. 3A, the differential amplifier circuit CM[1] to the differential amplifier circuit CM[n] bonded in a ring form can constitute an oscillator (ring oscillator). Note that in the structure of the oscillator, between some adjacent differential amplifier circuits, a non-inverting output terminal of one is electrically connected to a non-inverting input terminal of the other, and an inverting output terminal of the one is electrically connected to an inverting input terminal of the other. Between the other differential amplifier circuits, a non-inverting output terminal of a differential amplifier circuit in one stage is electrically connected to an inverting input terminal of a differential amplifier circuit in a subsequent stage, and an inverting output terminal of the differential amplifier circuit in the one stage is electrically connected to a non-inverting input terminal of the differential amplifier circuit in the subsequent stage.

Although FIG. 3A illustrates the circuit RGCM having a structure including the differential amplifier circuit CM[n+1], the circuit RGCM in FIG. 3A may have a structure not including the differential amplifier circuit CM[n+1]. For example, the circuit RGCM in FIG. 3A may have a structure in which the inverting output terminal of the differential amplifier circuit CM[n] is electrically connected to the terminal OCLN and the non-inverting output terminal of the differential amplifier circuit CM[n] is electrically connected to the terminal OCLP.

The differential amplifier circuit can operate at higher speed than a logic gate such as a NAND circuit, an AND circuit, or a NOT circuit (inverter circuit). In addition, the differential amplifier circuit has a feature of high resistance to power noise or the like. Thus, the circuit RGCM illustrated in FIG. 3A can be used as an oscillator in a high-frequency circuit or the like, for example.

Although the number of the differential amplifier circuits bonded in a ring form illustrated in FIG. 3A is an even number of four or more, but may be two depending on the case. In the case where the number of the differential amplifier circuits bonded in a ring form is an odd number of three or more, for example, the structure of the circuit RGCM illustrated in FIG. 3B can be employed, for example. The circuit RGCM in FIG. 3B is also a CML circuit functioning as an oscillator and includes the differential amplifier circuit CM[1] to a differential amplifier circuit CM[m+1] (here, m is an odd number of three or more).

Figure 3B:
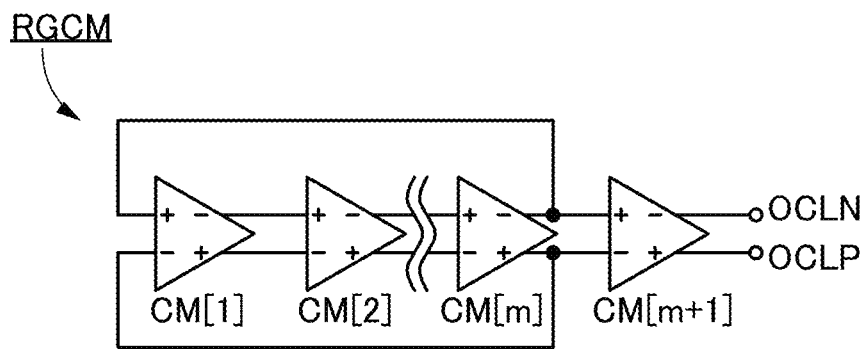

Although FIG. 3B illustrates the circuit RGCM having a structure including the differential amplifier circuit CM[m+1], the circuit RGCM in FIG. 3B may have a structure not including the differential amplifier circuit CM[m+1]. For example, the circuit RGCM in FIG. 3B may have a structure in which an inverting output terminal of the differential amplifier circuit CM[m] is electrically connected to the terminal OCLN and a non-inverting output terminal of the differential amplifier circuit CM[m] is electrically connected to the terminal OCLP.

[High-Speed Transmission Circuit]

Figure 3C:
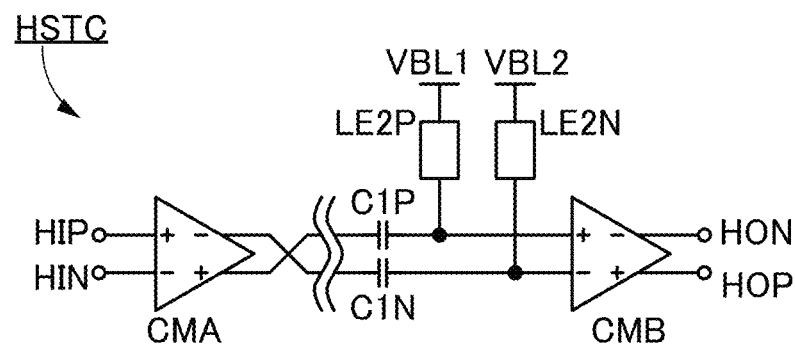

A circuit HSTC illustrated in FIG. 3C is a CML circuit functioning as a high-speed transmission circuit and includes a differential amplifier circuit CMA, a differential amplifier circuit CMB, a capacitor C1P, a capacitor C1N, a load LE2P, and a load LE2N.

In addition, the circuit HSTC includes a terminal HIP, a terminal HIN, a terminal HON, and a terminal HOP. The terminal HIP and the terminal HIN each function as an input terminal of the circuit HSTC, and the terminal HON and the terminal HOP each function as an output terminal of the circuit HSTC.

A non-inverting input terminal of the differential amplifier circuit CMA is electrically connected to the terminal HIP, and an inverting input terminal of the differential amplifier circuit CMA is electrically connected to the terminal HIN. An inverting output terminal of the differential amplifier circuit CMA is electrically connected to a first terminal of the capacitor C1N, and a non-inverting output terminal of the differential amplifier circuit CMA is electrically connected to a first terminal of the capacitor C1P. A second terminal of the capacitor C1P is electrically connected to a first terminal of the load LE2P and a non-inverting input terminal of the differential amplifier circuit CMB, and a second terminal of the capacitor C1N is electrically connected to a first terminal of the load LE2N and an inverting input terminal of the differential amplifier circuit CMB. An inverting output terminal of the differential amplifier circuit CMB is electrically connected to the terminal HON, and a non-inverting output terminal of the differential amplifier circuit CMB is electrically connected to the terminal HOP. A second terminal of the load LE2P is electrically connected to a wiring VBL1, and a second terminal of the load LE2N is electrically connected to a wiring VBL2.

The wiring VBL1 and the wiring VBL2 each function as a wiring for supplying a constant voltage. The constant voltage can be a positive potential, a negative potential, or a ground potential, for example. The constant voltages supplied from the wiring VBL1 and the wiring VBL2 may be equal to each other or different from each other.

Note that the capacitor C1P and the capacitor C1N function as DC blocking capacitors for making an AC connection between the differential amplifier circuit CMA and the differential amplifier circuit CMB.

The circuit HSTC illustrated in FIG. 3C has a feature of higher edge rate than an LVDS (Low Voltage Differential Signaling) circuit that is also a high-speed transmission circuit. In addition, the signal amplitude of the circuit HSTC can be larger than the signal amplitude of the LVDS circuit in some cases.

[Differential Amplifier Circuit]

Figure 4A:
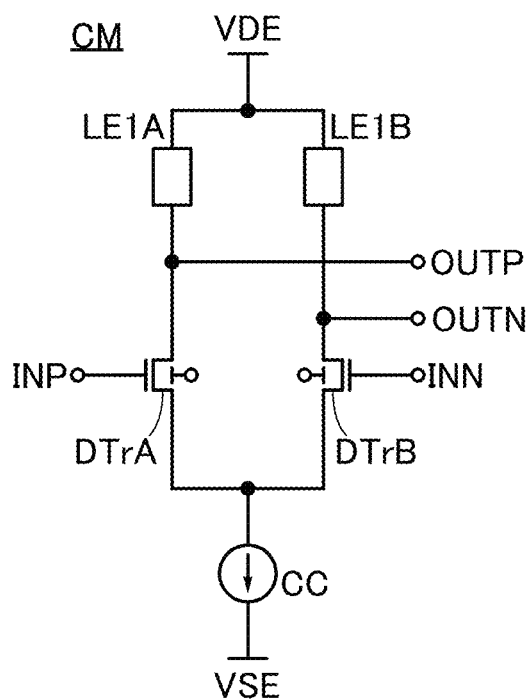
FIG. 4A to FIG. 4C are circuit diagrams illustrating structure examples of circuits included in a semiconductor device.

Next, a differential amplifier circuit that can be used in the circuit RGCM and the circuit HSTC is described. FIG. 4A illustrates a structure example of a differential amplifier circuit that can be used as the differential amplifier circuit CM[1] to the differential amplifier circuit CM[n+1] included in the circuit RGCM and the differential amplifier circuit CMA and the differential amplifier circuit CMB included in the circuit HSTC. The differential amplifier circuit CM illustrated in FIG. 4A includes a transistor DTrA, a transistor DTrB, a load LE1A, a load LE1B, and a current source CC, for example. The differential amplifier circuit CM also includes a terminal INP, a terminal INN, a terminal OUTP, and a terminal OUTN. In particular, the transistor DTrA and the transistor DTrB function as a differential pair.

Note that in the differential amplifier circuit CM, the terminal INP corresponds to the non-inverting input terminal, the terminal INN corresponds to the inverting input terminal, the terminal OUTP corresponds to the non-inverting output terminal, and the terminal OUTN corresponds to the inverting output terminal.

The transistor DTrA and/or the transistor DTrB are/is provided as the transistor OTr described above, for example.

The transistor DTrA and the transistor DTrB illustrated in FIG. 4A each include a back gate; however, the semiconductor device of one embodiment of the present invention is not limited thereto. For example, the transistor DTrA and the transistor DTrB illustrated in FIG. 4A may each be a transistor having a structure not including a back gate, that is, a single-gate structure. It is also possible that some transistors have a structure including a back gate and the other transistors have a structure not including a back gate.

The transistor DTrA and the transistor DTrB preferably have the equal size (e.g., channel length, channel width, and transistor structure). By making the transistors have the equal size, the transistors can have almost the same electrical characteristics. Thus, by making the transistor DTrA and the transistor DTrB have the equal size, the transistor DTrA and the transistor DTrB can perform almost the same operation under the same condition. The same condition here means, for example, potentials of a source, a drain, and a gate of the transistor DTrA or potentials of a source, a drain, and a gate of the transistor DTrB.

Unless otherwise specified, the transistor DTrA and the transistor DTrB in an on state may operate in a saturation region in the end. In other words, the gate voltage, the source voltage, and the drain voltage of each of the above transistors may be appropriately biased to voltages in the range where the transistor operates in a saturation region. However, one embodiment of the present invention is not limited thereto. For example, the transistor DTrA and the transistor DTrB in the on state may operate in a linear region or may operate both in a saturation region and a linear region.

A gate of the transistor DTrA is electrically connected to the terminal INP, and a first terminal of the transistor DTrA is electrically connected to a first terminal of the load LE1A and the terminal OUTP. A gate of the transistor DTrB is electrically connected to the terminal INN, and a first terminal of the transistor DTrB is electrically connected to a first terminal of the load LE1B and the terminal OUTN. An input terminal of the current source CC is electrically connected to a second terminal of the transistor DTrA and a second terminal of the transistor DTrB, and an output terminal of the current source CC is electrically connected to a wiring VSE. A second terminal of the load LE1A and a second terminal of the load LE1B are electrically connected to a wiring VDE.

The wiring VDE functions as a wiring for supplying a constant voltage, for example. The constant voltage can be a high-level potential, for example.

The wiring VSE functions as a wiring for supplying a constant voltage, for example. The constant voltage can be a low-level potential or a ground potential (GND), for example.

For each of the transistor DTrA and the transistor DTrB in FIG. 4A, the back gate is illustrated but the connection structure of the back gate is not illustrated; a target to which the back gate is electrically connected can be determined at the design stage. For example, in a transistor including a back gate, a gate and the back gate may be electrically connected to each other to increase the on-state current of the transistor. That is, for example, the gate and the back gate of the transistor DTrA may be electrically connected to each other, and the gate and the back gate of the transistor DTrB may be electrically connected to each other. Alternatively, for example, in a transistor including a back gate, a wiring for electrically connecting the back gate of the transistor to an external circuit or the like may be provided and a potential may be supplied to the back gate of the transistor with the external circuit or the like to change the threshold voltage of the transistor or to reduce the off-state current of the transistor. Specifically, the differential amplifier circuit CM can have a structure illustrated in FIG. 4B. The differential amplifier circuit CM in FIG. 4B has a structure in which a wiring BGE1 is electrically connected to the back gates of the transistor DTrA and the transistor DTrB included in the differential amplifier circuit CM in FIG. 4A.

By supplying a predetermined potential to the wiring BGE1, the threshold voltages of the transistor DTrA and the transistor DTrB can be changed.

Figure 4B:
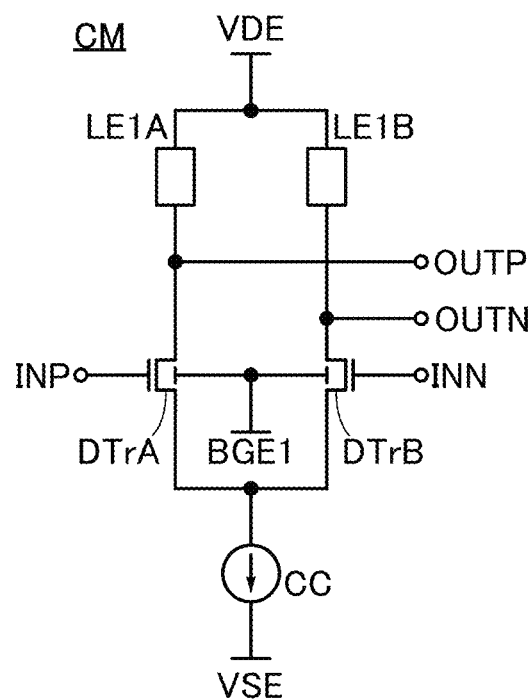

In addition, by changing the threshold voltages of the transistor DTrA and the transistor DTrB in the differential amplifier circuit CM in FIG. 4B, a desired gain can be obtained. Furthermore, in the packaged semiconductor device PSD as illustrated in FIG. 1 or the like, the threshold voltages of the transistor DTrA and the transistor DTrB can be adjusted.

The transistor DTrA and the transistor DTrB illustrated in FIG. 4A are n-channel transistors; however, the semiconductor device of one embodiment of the present invention is not limited thereto. For example, some or all of the transistors DTrA and the transistors DTrB may be replaced with p-channel transistors.

The above examples of changes in the structure and the polarity of the transistors are not limited to the transistor DTrA and the transistor DTrB. For example, similar changes may be made in the structure and the polarity of transistors described in other parts of the specification or transistors illustrated in other drawings.

Figure 4C:
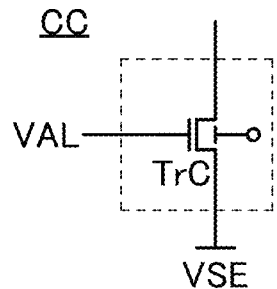

The current source CC included in the differential amplifier circuit CM in FIG. 4A can have a circuit structure illustrated in FIG. 4C, for example. Note that FIG. 4C also illustrates the wiring VSE to show the connection structure of the current source CC.

The current source CC illustrated in FIG. 4C includes a transistor TrC, for example.

As the transistor TrC, it is possible to use a transistor that can be used as the transistor DTrA or the transistor DTrB. For example, as the transistor TrC, it is possible to use an OS transistor that can be used as the transistor DTrA or the transistor DTrB.

Unless otherwise specified, the transistor TrC in an on state may operate in a saturation region in the end. In other words, the gate voltage, the source voltage, and the drain voltage of each of the above transistors may be appropriately biased to voltages in the range where the transistor operates in a saturation region. For example, the transistor TrC in the on state may operate in a linear region or may operate both in a saturation region and a linear region.

A first terminal of the transistor TrC is electrically connected to the input terminal of the current source CC, and a second terminal of the transistor TrC is electrically connected to an output terminal the current source CC. That is, in the case where the current source CC in FIG. 4C is used in the differential amplifier circuit CM in FIG. 4A, the first terminal of the transistor TrC is electrically connected to the second terminal of the transistor DTrA and the second terminal of the transistor DTrB. A gate of the transistor TrC is electrically connected to a wiring VAL.

The wiring VAL functions as a wiring for supplying a constant voltage, for example. In particular, the constant voltage is set such that a gate-source voltage of the transistor TrC is higher than the threshold voltage of the transistor TrC.

The load LE1A and the load LE1B can each be a resistor, a transistor, or the like, for example.

Figure 5A:
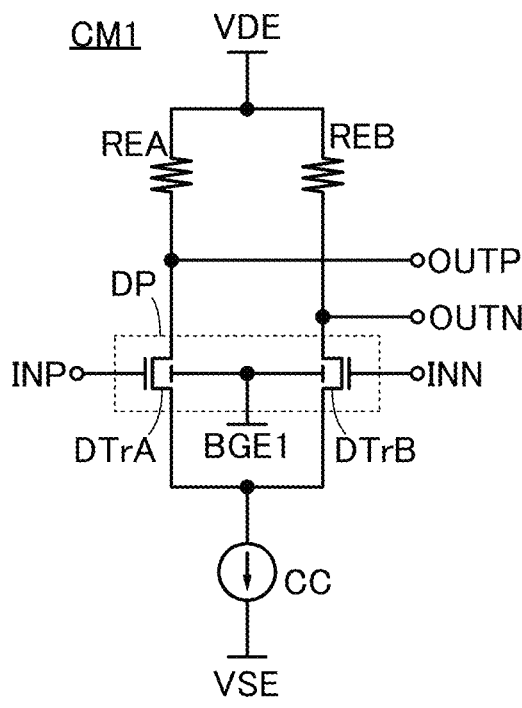
FIG. 5A to FIG. 5D are circuit diagrams illustrating structure examples of circuits included in a semiconductor device.

As an example, FIG. 5A illustrates a circuit structure of the case where the load LE1A and the load LE1B are each a resistor. A differential amplifier circuit CM1 illustrated in FIG. 5A has a circuit structure in which a resistor REA and a resistor REB are used as the load LE1A and the load LE1B, respectively. A first terminal of the resistor REA is electrically connected to the first terminal of the transistor DTrA and the terminal OUTP, and a first terminal of the resistor REB is electrically connected to the first terminal of the transistor DTrB and the terminal OUTN. A second terminal of the resistor REA and a second terminal of the resistor REB are electrically connected to the wiring VDE.

Figure 5B:
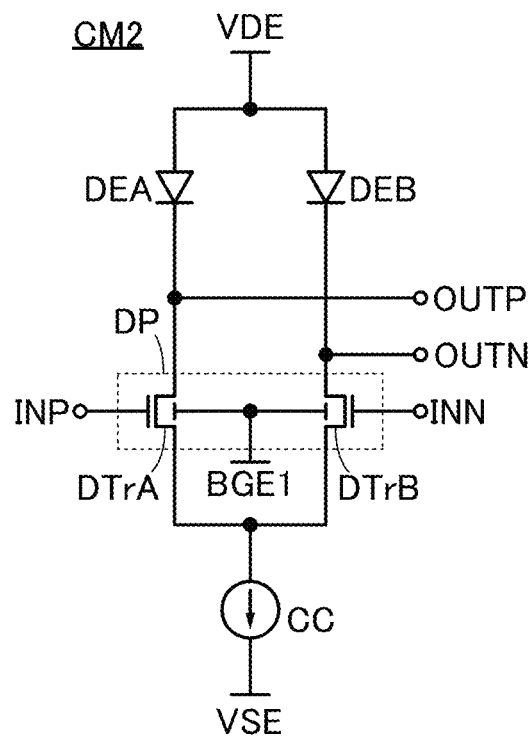

As another example, FIG. 5B illustrates a circuit structure of the case where the load LE1A and the load LE1B are each a diode. A differential amplifier circuit CM2 illustrated in FIG. 5B has a circuit structure in which a diode DEA and a diode DEB are used as the load LE1A and the load LE1B, respectively. An output terminal of the diode DEA is electrically connected to the first terminal of the transistor DTrA and the terminal OUTP, and an output terminal of the diode DEB is electrically connected to the first terminal of the transistor DTrB and the terminal OUTN. An input terminal of the diode DEA and an input terminal of the diode DEB are electrically connected to the wiring VDE.

A diode-connected transistor may be used as each of the diode DEA and the diode DEB included in the differential amplifier circuit CM2 illustrated in FIG. 5B. The differential amplifier circuit CM2 illustrated in FIG. 5C has a circuit structure in which a transistor ITrA and a transistor ITrB are used as the diode DEA and the diode DEB, respectively. A first terminal of the transistor ITrA is electrically connected to the first terminal of the transistor DTrA and the terminal OUTP, and a first terminal of the transistor ITrB is electrically connected to the first terminal of the transistor DTrB and the terminal OUTN. The wiring VDE is electrically connected to a second terminal of the transistor ITrA, a gate of the transistor ITrA, a second terminal of the transistor ITrB, and a gate of the transistor ITrB.

As each of the transistor ITrA and the transistor ITrB, it is possible to use a transistor that can be used as the transistor DTrA or the transistor DTrB. For example, an OS transistor can be used as the transistor TrC.

Figure 5C:
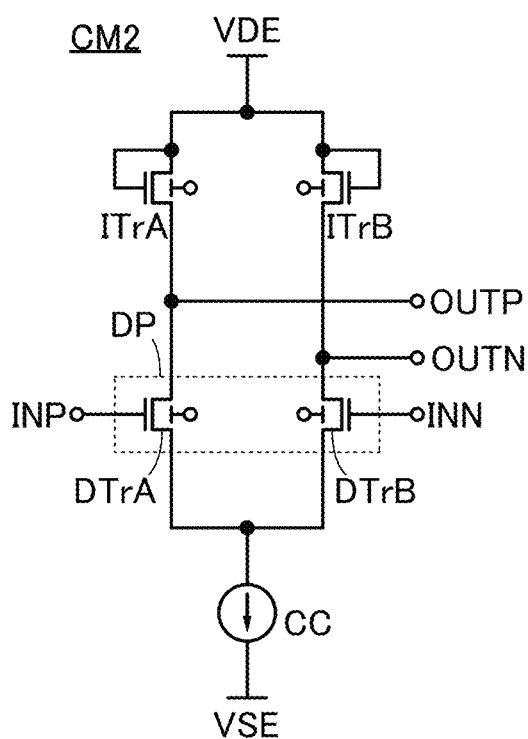
Figure 5D:
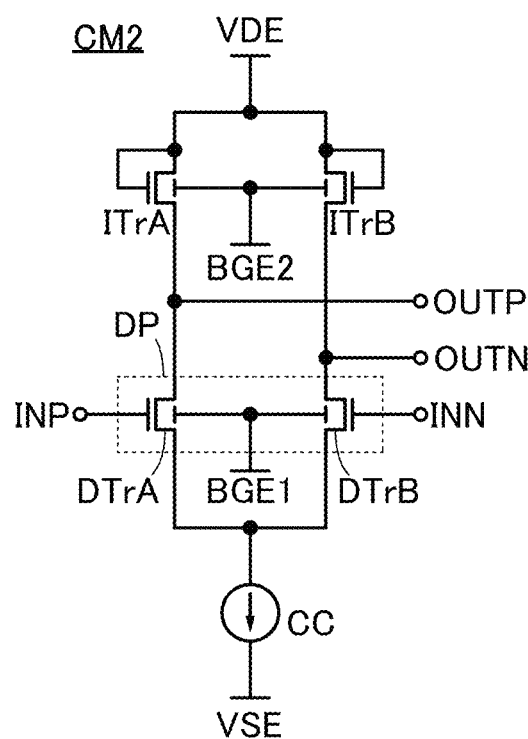

As illustrated in FIG. 5C, the transistor ITrA and the transistor ITrB may each be a transistor including a back gate, like the transistor DTrA or the transistor DTrB. In addition, as in the transistor DTrA and the transistor DTrB in the differential amplifier circuit CM in FIG. 4B, a wiring for supplying a potential may be electrically connected to the back gates of the transistor ITrA and the transistor ITrB. Specifically, for example, the differential amplifier circuit CM2 in FIG. 5C may have a structure in which a wiring BGE2 is electrically connected to the back gates of the transistor ITrA and the transistor ITrB, as in the differential amplifier circuit CM2 illustrated in FIG. 5D. In FIG. 5D, the threshold voltages of the transistor ITrA and the transistor ITrB can be changed by supplying a predetermined potential to the wiring BGE2. Note that the differential amplifier circuit CM2 in FIG. 5D has a structure in which the wiring BGE1 is electrically connected to the back gates of the transistor DTrA and the transistor DTrB, like the differential amplifier circuit CM in FIG. 4B.

In addition, by changing the threshold voltages of the transistor DTrA, the transistor DTrB, the transistor ITrA, and the transistor ITrB in the differential amplifier circuit CM in FIG. 5D, a desired gain can be obtained. In the packaged semiconductor device PSD as illustrated in FIG. 1 or the like, the threshold voltages of the transistor DTrA, the transistor DTrB, the transistor ITrA, and the transistor ITrB can be adjusted.

Fabrication Example 1 of Semiconductor Device

Next, an example of a method for fabricating the semiconductor device PSD will be described.

Figure 6A:
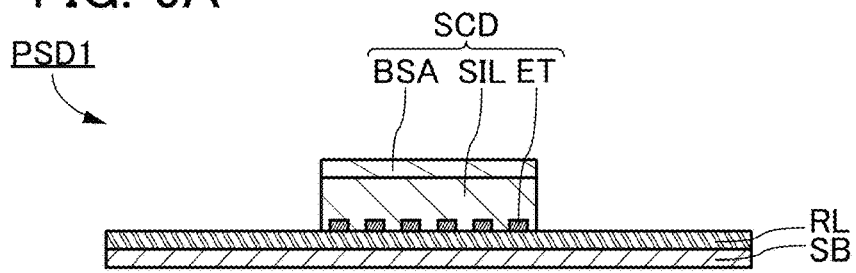
FIG. 6A to FIG. 6E are schematic cross-sectional views illustrating an example of a method for fabricating a semiconductor device.
Figure 6B:
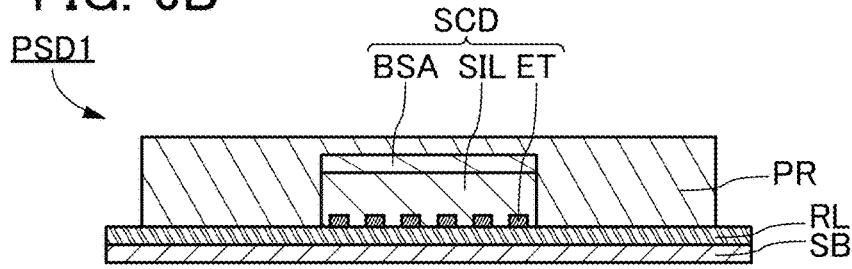
Figure 6C:
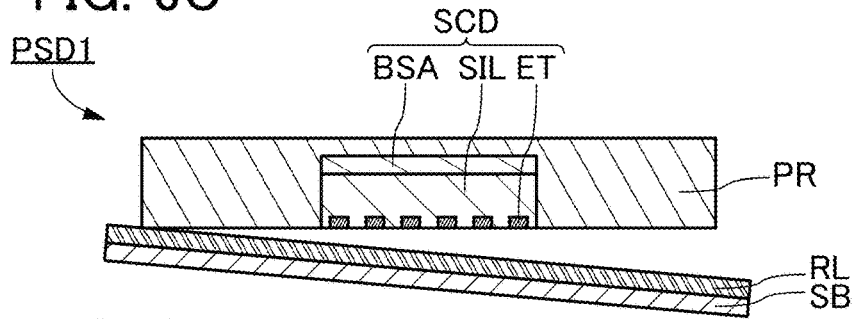
Figure 6D:
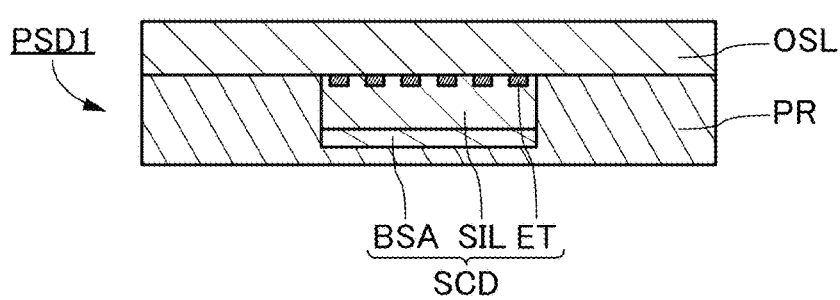
Figure 6E:
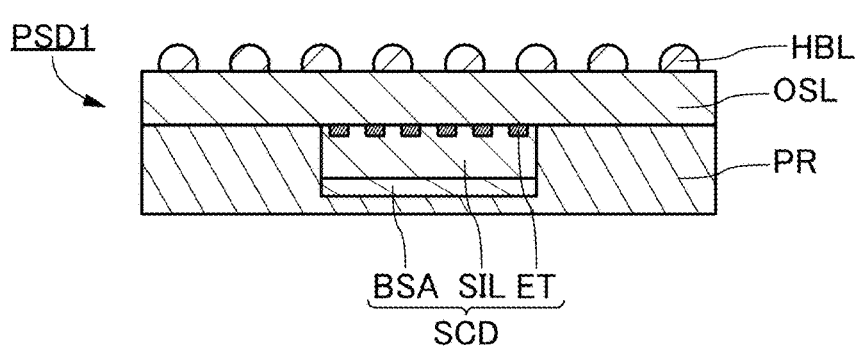

FIG. 6A to FIG. 6D are cross-sectional views schematically illustrating the semiconductor device PSD1 in the middle of the fabrication process, and FIG. 6E is a cross-sectional view schematically illustrating the semiconductor device PSD1 whose fabrication process has been completed. Note that this fabrication method includes a first step to a fifth step.

<<First Step>>

First, the die SCD is prepared. The die SCD can be obtained through a semiconductor process for forming a circuit over a wafer, a wafer polishing step, a dicing step, and the like, for example.

Note that in the die SCD illustrated in FIG. 6A to FIG. 6E, the electrical connection terminal ET is provided in the layer SIL.

Next, the die SCD is bonded to be fixed onto a support SB including a separation layer RL (see FIG. 6A). Specifically, bonding is performed such that the layer SIL and the connection terminal ET of the die SCD are in contact with the separation layer RL of the support SB.

Examples of the support SB include a semiconductor substrate (e.g., a single crystal substrate or a silicon substrate), an SOI (Silicon On Insulator) substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, paper including a fibrous material, and a base material film. Examples of the glass substrate include barium borosilicate glass, aluminoborosilicate glass, and soda lime glass. As examples of the flexible substrate, the attachment film, the base material film, and the like, the following can be given. The examples include plastics typified by polyethylene terephthalate (PET), polyethylene naphthalate (PEN), polyether sulfone (PES), and polytetrafluoroethylene (PTFE). Another example is a synthetic resin such as acrylic. Other examples include polypropylene, polyester, polyvinyl fluoride, and polyvinyl chloride. Other examples include polyamide, polyimide, aramid, an epoxy resin, an inorganic vapor deposition film, and paper.

The separation layer RL can be a stacked-layer film including a tungsten film and a silicon oxide film, or an organic resin film of polyimide or the like, for example. Alternatively, the separation layer RL can be a tape whose adhesion is decreased by light such as ultraviolet rays.

<<Second Step>>

Next, the insulator PR is molded over the die SCD and the separation layer RL (see FIG. 6B).

Specifically, the insulator PR is molded using, for example, an organic resin or the like described above as a material for the insulator PR, with use of a mold or the like.

<<Third Step>>

Next, the die SCD and the molded insulator PR are separated from the support SB and the separation layer RL (see FIG. 6C). By this step, the connection terminal ET of the die SCD is preferably exposed. In addition, after the separation from the support SB and the separation layer RL, surface polishing treatment, removal of an organic substance by irradiation with ultraviolet rays under an ozone atmosphere, or the like may be performed.

<<Fourth Step>>

Next, the layer OSL is formed over the die SCD and the insulator PR (see FIG. 6D).

Note that the die SCD and the insulator PR illustrated in FIG. 6D are rotated by 180° from the die SCD and the insulator PR in FIG. 6C.

The layer OSL can be formed through a semiconductor process, for example. In particular, in the formation process of the layer OSL, a wiring, a terminal, a pad, or the like (not illustrated) is formed over the connection terminal ET included in the die SCD. In addition, over a surface of the layer OSL opposite to the surface provided with the die SCD, a wiring, a terminal, a pad, or the like (not illustrated) is formed to be exposed.

Through the semiconductor process, the transistor OTr can be formed in the layer OSL.

By forming the layer OSL, the transistor OTr and a wiring electrically connected to the connection terminal ET of the die SCD can be formed in the layer OSL.

<<Fifth Step>>

Next, the bump HBL is formed on the wiring, the terminal, the pad, or the like of the layer OSL which is exposed at the surface of the layer OSL on the opposite side of the surface provided with the die SCD (see FIG. 6E). Note that the bump HBL is provided to be electrically connected to the wiring included in the layer OSL.

Note that the bump HBL may be formed using a solder or the like.

Through the fabrication process including the first step to the fifth step described above, the semiconductor device having the FOWLP structure can be fabricated.

Fabrication Example 2 of Semiconductor Device

Described here is an example of a method for fabricating a semiconductor device having a structure different from that of the semiconductor device PSD in FIG. 1.

Figure 7A:
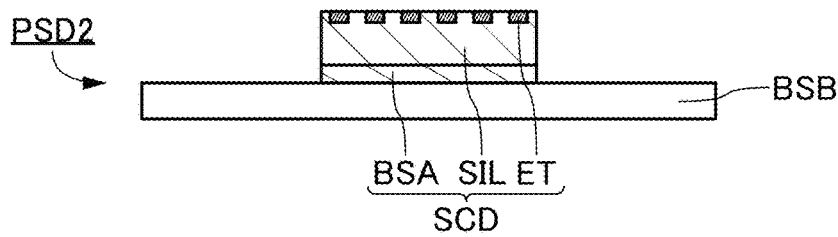
FIG. 7A to FIG. 7E are schematic cross-sectional views illustrating an example of a method for fabricating a semiconductor device.
Figure 7B:
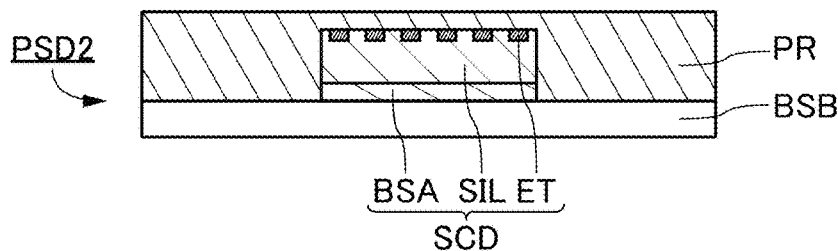
Figure 7C:
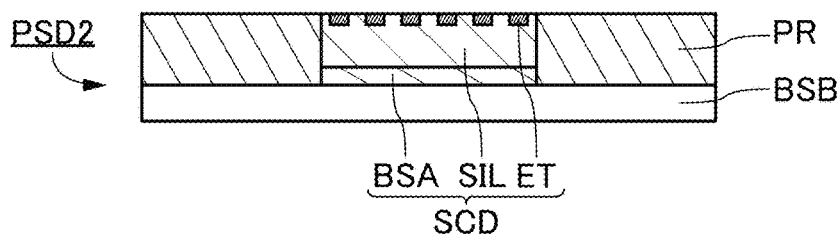
Figure 7D:
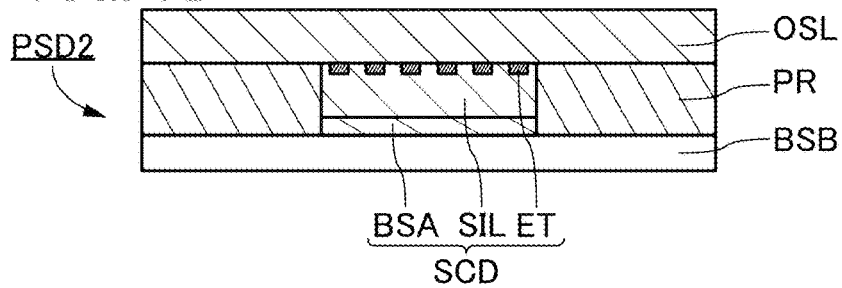
Figure 7E:
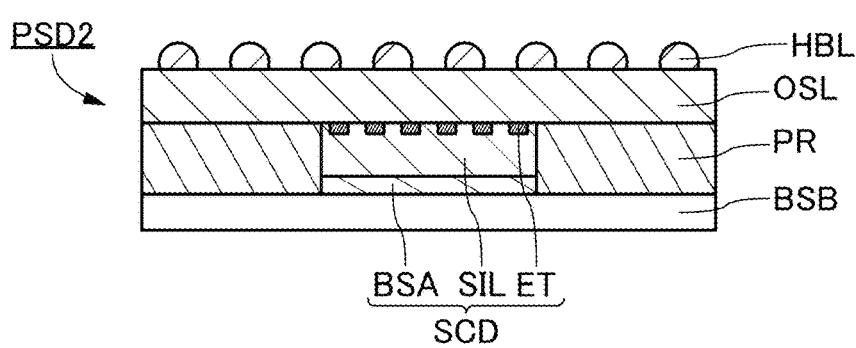

FIG. 7A to FIG. 7D are cross-sectional views schematically illustrating a semiconductor device PSD2 in the middle of fabrication process, and FIG. 7E is a cross-sectional view schematically illustrating the semiconductor device PSD2 whose fabrication process has been completed. Note that this fabrication process includes a first step to a fifth step.

<<First Step>>

First, the die SCD is prepared. For the die SCD, the description of the die SCD described in Fabrication example 1 of semiconductor device is referred to.

Next, the die SCD is bonded to be fixed onto a substrate BSB (see FIG. 7A). Specifically, bonding is performed such that the substrate BSA of the die SCD and the substrate BSB are in contact with each other.

As the substrate BSB, it is possible to use a semiconductor substrate (e.g., a single crystal substrate or a silicon substrate), an SOI substrate, a glass substrate, a quartz substrate, a plastic substrate, a sapphire glass substrate, a metal substrate, a stainless steel substrate, a substrate including stainless steel foil, a tungsten substrate, a substrate including tungsten foil, or the like, for example. In particular, in the case where treatment applying heat to the die SCD and the substrate BSB is performed after the second step, the substrate BSB is preferably a substrate having heat resistance.

For bonding the die SCD and the substrate BSB, a die bonding film or the like can be used (not illustrated in FIG. 7A to FIG. 7E).

<<Second Step>>

Next, the insulator PR is molded over the die SCD and the substrate BSB (see FIG. 7B).

Specifically, the insulator PR is molded using, for example, an organic resin or the like described above as a material for the insulator PR, with use of a mold or the like.

<<Third Step>>

Next, the upper portion of the molded insulator PR is removed until the connection terminal ET of the die SCD is exposed (see FIG. 7C). Examples of a method for removing the upper portion of the insulator PR include polishing treatment, etching treatment, and ashing treatment. After the polishing treatment, the etching treatment, the ashing treatment, or the like is performed, removal (e.g., a washing step in which irradiation with ultraviolet rays is performed under an ozone atmosphere) of an organic substance such as a residue of a chemical solution that is unintentionally attached or a residue of the insulator PR (sometimes also referred to as a residue of an organic substance) may be performed on the surface subjected to the treatment.

<<Fourth Step>>

Next, the layer OSL is formed over the die SCD and the insulator PR (see FIG. 7D).

For the formation of the layer OSL, the description of the fourth step described in Fabrication method 1 of semiconductor device is referred to.

By forming of the layer OSL, a wiring electrically connected to the connection terminal ET of the die SCD and the transistor OTr can be formed in the layer OSL.

<<Fifth Step>>

Next, the bump HBL is formed on the wiring, the terminal, the pad, or the like (not illustrated in FIG. 7A to FIG. 7E) in the layer OSL which is exposed at the surface of the layer OSL on the opposite side of the surface provided with the die SCD (see FIG. 7E).

For the formation of the bump HBL, the description of the fifth step described in Fabrication example 1 of semiconductor device is referred to.

Through the fabrication process including the first step to the fifth step described above, the semiconductor device that has the FOWLP structure and is different from the semiconductor device PSD in FIG. 1 (the semiconductor device PSD1 in FIG. 6E) can be fabricated.

Fabrication Example 3 of Semiconductor Device

Next, an example of a method for fabricating the semiconductor device PSD, which is different from the fabrication process illustrated in FIG. 6A to FIG. 6E and the fabrication process illustrated in FIG. 7A to FIG. 7E will be described.

Figure 8A:
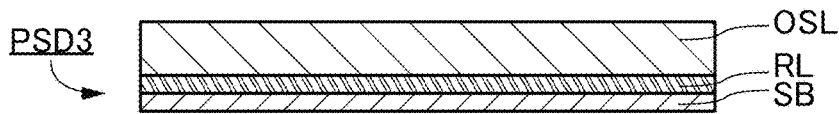
FIG. 8A to FIG. 8E are schematic cross-sectional views illustrating an example of a method for fabricating a semiconductor device.
Figure 8B:
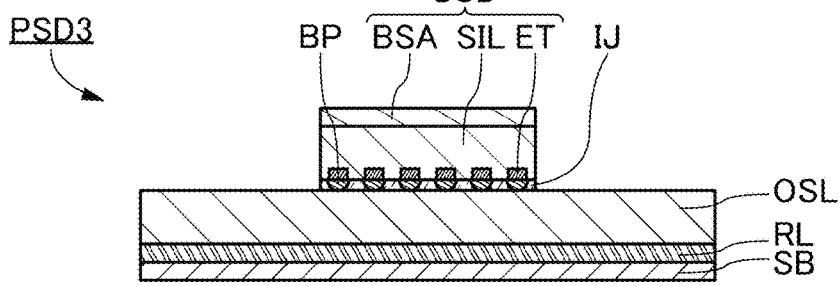
Figure 8C:
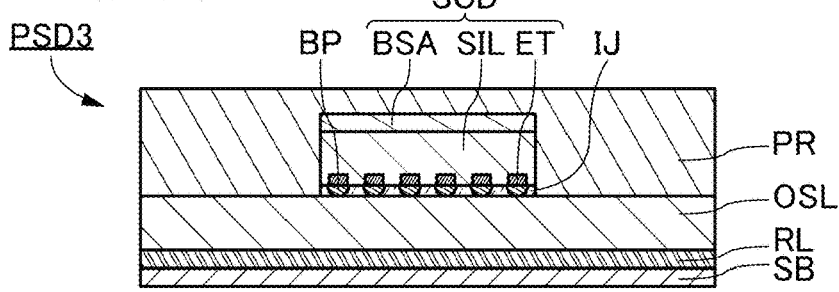
Figure 8D:
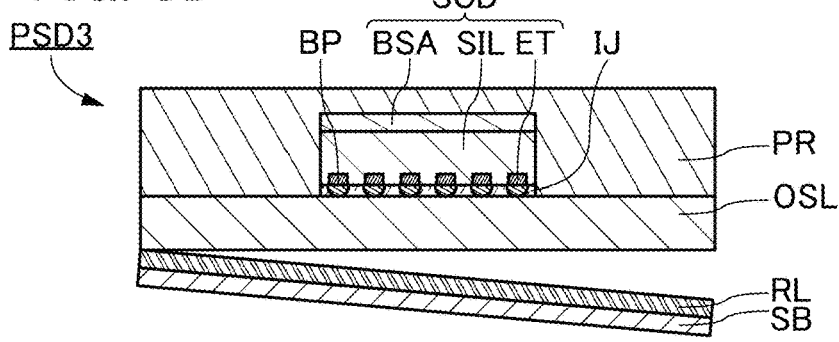
Figure 8E:
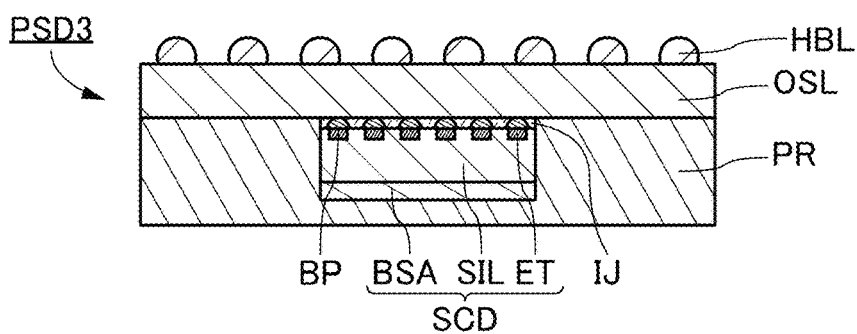

FIG. 8A to FIG. 8D are cross-sectional views schematically illustrating a semiconductor device PSD3 in the middle of fabrication process, and FIG. 8E is a cross-sectional view schematically illustrating the semiconductor device PSD3 whose fabrication process has been completed. Note that this fabrication method includes a first step to a fifth step.

<<First Step>>

First, the support SB including the separation layer RL is prepared. For the separation layer RL or the support SB, the description of the separation layer RL or the support SB described in Fabrication example 1 of semiconductor device is referred to.

Next, the layer OSL is formed over the separation layer RL (see FIG. 8A). The layer OSL can be formed through a semiconductor process, as in Fabrication example 1 and Fabrication example 2 of semiconductor device described above. In particular, in the formation process of the layer OSL, a wiring, a terminal, a pad, or the like (not illustrated) for electrical connection to the bump HBL described later is formed on a side of the surface provided with the separation layer RL, and a wiring, a terminal, a pad, or the like (not illustrated) for electrical connection to the die SCD described later is formed on the opposite side of the surface provided with the separation layer RL. As in Fabrication example 1 and Fabrication example 2 of semiconductor device described above, the transistor OTr can be formed in the layer OSL.

In this manner, a wiring and the transistor OTr can be formed in the layer OSL.

<<Second Step>>

Next, the die SCD is prepared. For the die SCD, the description of the die SCD described in Fabrication example 1 of semiconductor device is referred to.

Next, the die SCD is mounted on the layer OSL by flip-chip bonding (see FIG. 8B). Specifically, the connection terminal ET provided in the die SCD is electrically connected to the wiring, the terminal, the pad, or the like exposed at the top surface of the layer OSL using a solder or the like. In FIG. 8B, the bump BP is formed to be in contact with the connection terminal ET of the die SCD.

Examples of the flip-chip bonding include a method in which a resin containing an anisotropic conductive particle is injected between the layer OSL and the die SCD for bonding and a method in which a SnAg solder is used for bonding. Alternatively, ultrasonic wave bonding can be used in the case where the bump and a conductor connected to the bump are gold. To reduce physical stress such as an impact or to reduce thermal stress, for example, injection of an under-fill agent between the layer OSL and the die SCD may be performed in addition to the above flip-chip bonding method.

Note that FIG. 8B illustrates, as an example, a structure in which the layer OSL and the die SCD are bonded to each other by an insulating resin IJ therebetween. The insulating resin IJ can be a resin containing an anisotropic conductive particle, an under-fill agent, or the like, for example. Note that depending on the method for bonding the layer OSL and the die SCD, the insulating resin IJ is not necessarily injected.

<<Third Step>>

Next, the insulator PR is molded over the layer OSL and the die SCD (see FIG. 8C).

Specifically, the insulator PR is molded using, for example, an organic resin described above as a material for the insulator PR, with use of a mold or the like.

<<Fourth Step>>

Next, the layer OSL, the die SCD, and the molded insulator PR are separated from the support SB and the separation layer RL (see FIG. 8D). By this step, the wiring, the terminal, the pad, or the like (not illustrated in FIG. 8A to FIG. 8E) of the layer OSL is preferably exposed at a surface of the layer OSL opposite to the surface provided with the die SCD. In addition, after the separation of the support SB and the separation layer RL, surface polishing treatment, removal of an organic substance by irradiation with ultraviolet rays under an ozone atmosphere, or the like may be performed.

<<Fifth Step>>

Next, the bump HBL is formed on the wiring, the terminal, the pad, or the like of the layer OSL which is exposed at the surface of the layer OSL on the opposite side of the surface provided with the die SCD (see FIG. 8E).

Note that the layer OSL, the die SCD, and the insulator PR illustrated in FIG. 8E are rotated by 180° from the die SCD and the insulator PR in FIG. 8D.

For the formation of the bump HBL, the description of the fifth step described in Fabrication example 1 of semiconductor device is referred to.

Through the fabrication process including the first step to the fifth step described above, the semiconductor device that has the FOWLP structure and is different from the semiconductor device PSD in FIG. 1 (the semiconductor device PSD1 in FIG. 6E) and the semiconductor device PSD2 in FIG. 7E can be fabricated.

In the case where the semiconductor device is formed to be the FOWLP, it is difficult to form a bipolar transistor or a MOS transistor in a redistribution layer (corresponding to the layer OSL in FIG. 1) of the FOWLP. For example, it is difficult to form a CML circuit using a bipolar transistor, a CML circuit using a MOS transistor, or the like in the redistribution layer of the FOWLP. On the other hand, an OS transistor can be formed in the redistribution layer of the semiconductor device that is the FOWLP, and accordingly a circuit using the OS transistor can be provided in the redistribution layer of the semiconductor device that is the FOWLP, as described above. Thus, when the place of a circuit conventionally formed in a die is changed, as a circuit using an OS transistor, to the redistribution layer of the semiconductor device that is the FOWLP, for example, the mounting area of the die on the redistribution layer can be reduced and the cost of the die can be reduced.

Since the CML circuit using an OS transistor can be provided in the redistribution layer of the FOWLP, the semiconductor device having the FOWLP structure can perform high-speed data transmission in inputting/outputting of the semiconductor device.

Figure 9:
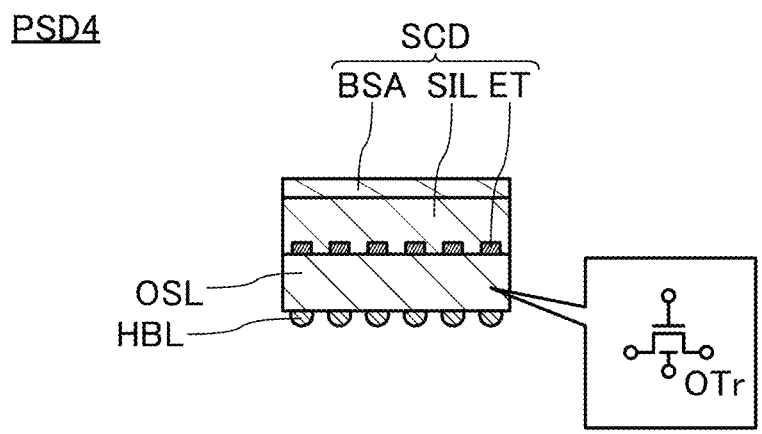
FIG. 9 is a schematic cross-sectional view illustrating a structure example of a semiconductor device.

Although this embodiment describes a semiconductor device having the FOWLP structure that is a mode of a package in which the pitch of connection terminals of a die is increased so that the connection terminals are provided in a wider area than the die with the use of a redistribution layer, one embodiment of the present invention is not limited thereto. For example, a semiconductor device of one embodiment of the present invention may be a semiconductor device PSD4 having a mode of a wafer level chip size package (sometimes also referred to as WLCSP or FIWLP (Fan In Wafer Level Package)) illustrated in FIG. 9. The semiconductor device PSD4 has a structure in which the connection terminal ET of the die SCD is electrically connected to the bump HBL through the layer OSL corresponding to the redistribution layer. As in the layer OSL of the semiconductor device PSD in FIG. 1, a circuit using an OS transistor may be provided in the layer OSL of the semiconductor device PSD4 in FIG. 9. The circuit may be a CML circuit. The semiconductor device PSD4 may be fabricated in such a manner that the layer OSL and the bump HBL are formed over a semiconductor wafer before the die SCD is cut out, and then the semiconductor wafer is cut out into a predetermined size. Alternatively, the semiconductor device PSD4 may be fabricated in such a manner that the layer OSL is formed over a semiconductor wafer, the semiconductor wafer is cut out into a predetermined size, and then the bump HBL is formed.

Although this embodiment describes the semiconductor device having the FOWLP structure using a die whose surface facing a semiconductor substrate is provided with a connection terminal, one embodiment of the present invention is not limited thereto. For example, one embodiment of the present invention may be a semiconductor device in which a connection terminal is provided on the semiconductor substrate side of the die with the use of a TSV (Through Silicon Via) and the semiconductor substrate and the redistribution layer face each other.

Note that this embodiment can be combined with any of the other embodiments in this specification as appropriate.

Embodiment 2

In this embodiment, structure examples of a semiconductor device of embodiments of the present invention will be described.

Structure Example 1 of Semiconductor Device

Figure 10:
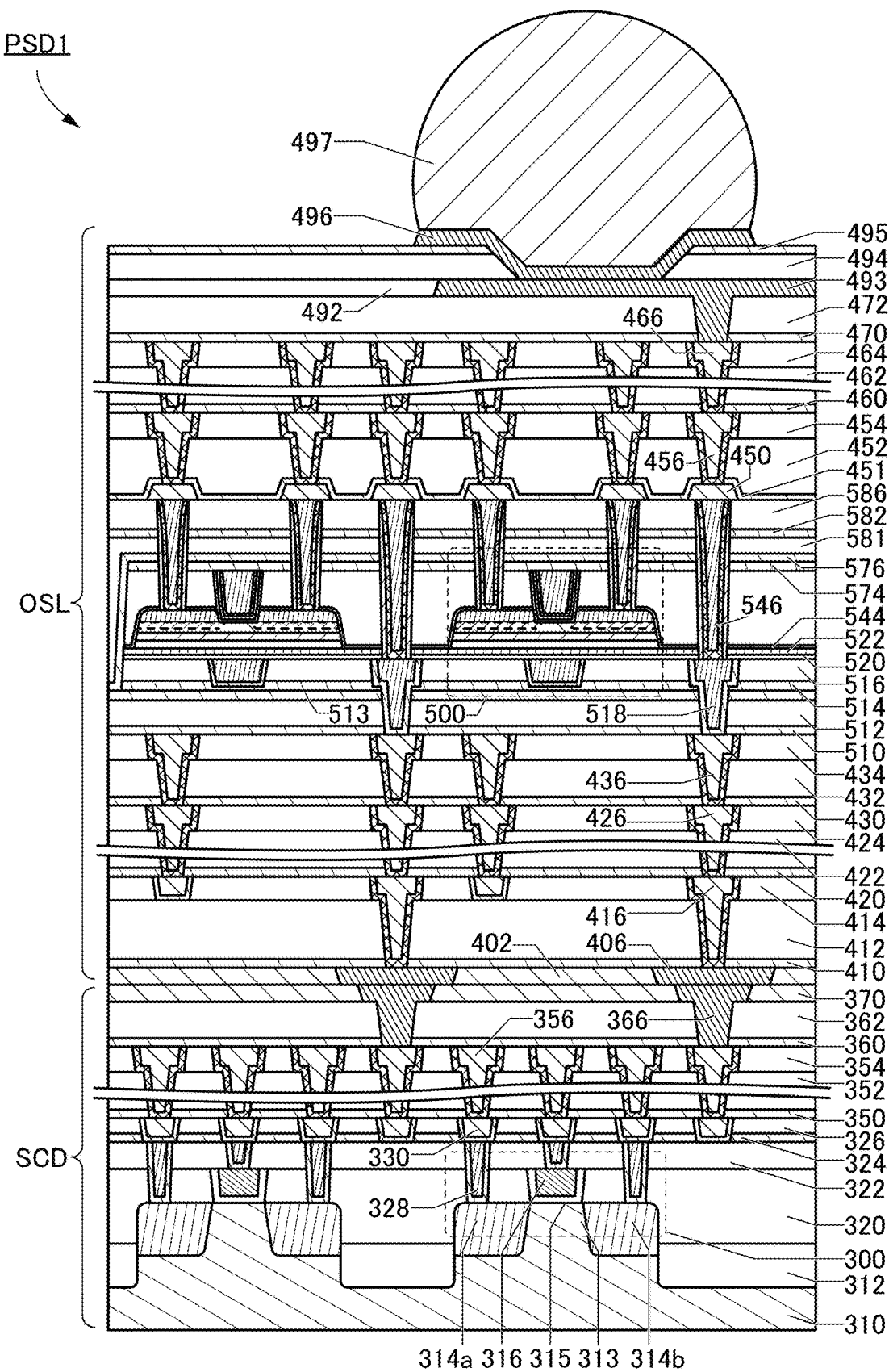
FIG. 10 is a schematic cross-sectional view illustrating a structure example of a semiconductor device.
Figure 11A:
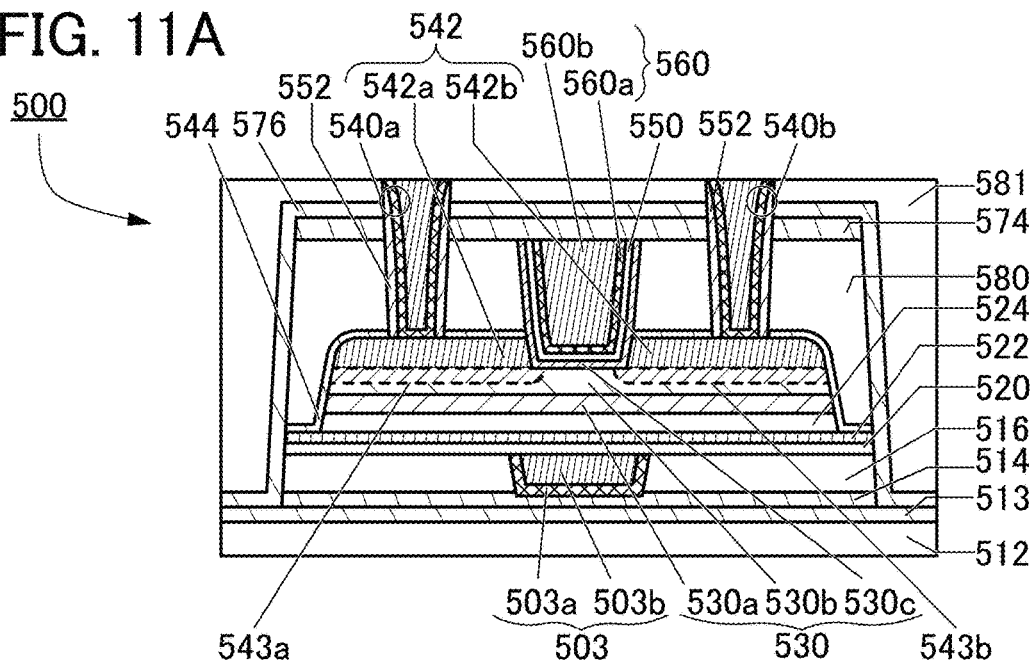
FIG. 11A to FIG. 11C are schematic cross-sectional views illustrating structure examples of transistors.
Figure 11B:
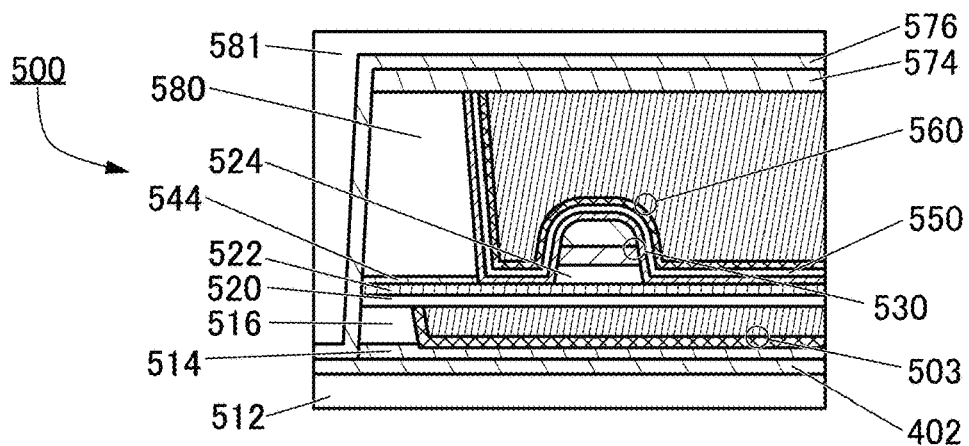
Figure 11C:
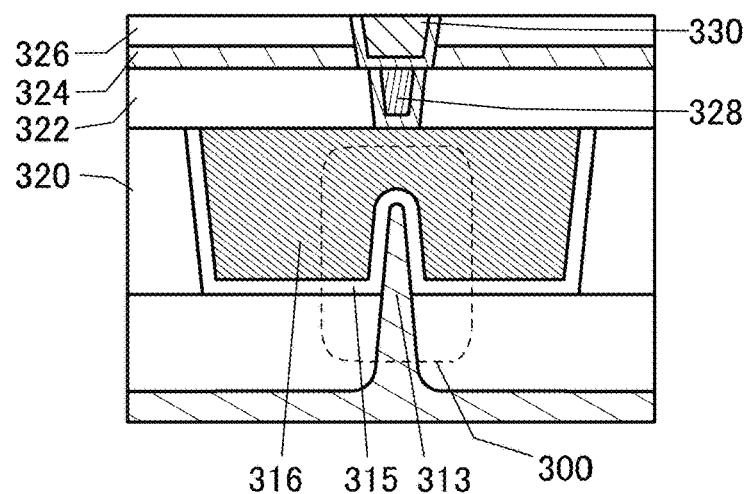

FIG. 10 is a cross-sectional view schematically illustrating a structure example of the semiconductor device PSD1 described in Embodiment 1. Specifically, the semiconductor device PSD1 illustrated in FIG. 10 includes a transistor 300 and a transistor 500, for example. FIG. 11A shows a cross-sectional view of the transistor 500 in the channel length direction, FIG. 11B shows a cross-sectional view of the transistor 500 in the channel width direction, and FIG. 11C shows a cross-sectional view of the transistor 300 in the channel width direction.

The transistor 500 is a transistor containing a metal oxide in a channel formation region (an OS transistor). The transistor 500 has features that the off-state current is low and that the field-effect mobility does not change even at high temperature. When the transistor 500 is used as a transistor included in the semiconductor device PSD1 or the like described in the above embodiment, a semiconductor device whose operating capability does not deteriorate even at high temperature can be achieved. In particular, an OS transistor has a feature of an extremely low off-state current; thus, using the OS transistor as a transistor included in a memory cell or the like can prevent degradation of a potential retained in the memory cell due to a current through the transistor. That is, the potential retained in the memory cell can be stored for a long time.

The transistor 300 includes a conductor 316, an element isolation layer 312, an insulator 315, a semiconductor region 313 that is part of a substrate 310, and a low-resistance region 314a and a low-resistance region 314b each functioning as a source region or a drain region. Note that the transistor 300 can be used as the transistor or the like included in the layer SIL described in the above embodiment, for example.

Note that the substrate BSA included in the die SCD described in the above embodiment corresponds to the substrate 310 illustrated in FIG. 10. The layer OSL is provided above the die SCD. Thus, in the semiconductor device PSD1 in FIG. 10, the transistor 500 is provided above the transistor 300.

In the transistor 300, a top surface and a side surface of the semiconductor region 313 in the channel width direction are covered with the conductor 316 with the insulator 315 therebetween, as illustrated in FIG. 11C. Such a Fin-type transistor 300 can have an increased effective channel width, and thus the transistor 300 can have improved on-state characteristics. In addition, since contribution of an electric field of a gate electrode can be increased, the off-state characteristics of the transistor 300 can be improved.

Note that the transistor 300 can be either a p-channel transistor or an n-channel transistor.

A region of the semiconductor region 313 where a channel is formed, a region in the vicinity thereof, the low-resistance region 314a and the low-resistance region 314b each functioning as a source region or a drain region, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), GaN (gallium nitride), or the like. A structure using silicon whose effective mass is controlled by applying stress to the crystal lattice and changing the lattice spacing may be employed. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to the semiconductor material used in the semiconductor region 313.

For the conductor 316 functioning as a gate electrode, a semiconductor material such as silicon containing an element that imparts n-type conductivity, such as arsenic or phosphorus, or an element that imparts p-type conductivity, such as boron, or a conductive material such as a metal material, an alloy material, or a metal oxide material can be used.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

The element isolation layer 312 is provided to separate a plurality of transistors on the substrate 310 from each other. The element isolation layer 312 can be formed by, for example, a LOCOS (LOCal Oxidation of Silicon) method, an STI (Shallow Trench Isolation) method, a mesa isolation method, or the like.

Note that the transistor 300 illustrated in FIG. 10 and FIG. 11C is an example and the structure is not limited thereto; an appropriate transistor can be used in accordance with a circuit structure, a driving method, or the like. For example, the transistor 300 illustrated in FIG. 10 and FIG. 11C may be a planar transistor.

Structure Example of Die SCD

Next, a structure example of the die SCD will be described.

Over the transistor 300 illustrated in FIG. 10, an insulator 320, an insulator 322, an insulator 324, and an insulator 326 are sequentially stacked from the substrate 310 side.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, aluminum nitride, or the like is used, for example.

Note that in this specification, silicon oxynitride refers to a material that contains oxygen at a higher proportion than nitrogen, and silicon nitride oxide refers to a material that contains nitrogen at a higher proportion than oxygen. Furthermore, in this specification, aluminum oxynitride refers to a material that contains oxygen at a higher proportion than nitrogen, and aluminum nitride oxide refers to a material that contains nitrogen at a higher proportion than oxygen.

The insulator 322 may have a function of a planarization film for planarizing a level difference caused by the transistor 300 or the like covered with the insulator 320 and the insulator 322. For example, a top surface of the insulator 322 may be planarized by planarization treatment using a chemical mechanical polishing (CMP) method or the like to increase planarity.

As the insulator 324, it is preferable to use a film having a barrier property that prevents diffusion of impurities such as water and hydrogen from the substrate 310, the transistor 300, or the like into a region where the transistor 500 is provided.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per unit area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material with a low permittivity is used for an interlayer film, parasitic capacitance generated between wirings can be reduced.

Moreover, a conductor 328, a conductor 330, and the like are embedded in the insulator 320, the insulator 322, the insulator 324, and the insulator 326. Note that the conductor 328 and the conductor 330 each have a function of a plug or a wiring. Furthermore, a plurality of conductors functioning as plugs or wirings are collectively denoted by the same reference numeral in some cases. Moreover, in this specification and the like, a wiring and a plug connected to the wiring may be a single component. That is, there are cases where a part of a conductor functions as a wiring and another part of the conductor functions as a plug.

As a material of each of plugs and wirings (e.g., the conductor 328 and the conductor 330), a single layer or stacked layers of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to form the plugs and wirings using a low-resistance conductive material such as aluminum or copper. The use of a low-resistance conductive material can reduce wiring resistance.

A wiring layer may be provided over the insulator 326 and the conductor 330. For example, in FIG. 10, an insulator 350, an insulator 352, and an insulator 354 are sequentially stacked over the insulator 326 and the conductor 330. Furthermore, a conductor 356 is formed in the insulator 350, the insulator 352, and the insulator 354. The conductor 356 has a function of a plug or a wiring connected to the transistor 300, for example. Note that the conductor 356 can be provided using a material similar to those for the conductor 328 and the conductor 330.

For example, like the insulator 324, the insulator 350 is preferably formed using an insulator having a barrier property against impurities such as water and hydrogen. The insulator 352 and the insulator 354 are preferably formed using an insulator having a relatively low dielectric constant to reduce the parasitic capacitance generated between wirings, like the insulator 326. Furthermore, the conductor 356 preferably contains a conductor having a barrier property against impurities such as water and hydrogen. In particular, the conductor having a barrier property against hydrogen is formed in an opening portion of the insulator 350 having a barrier property against hydrogen. With this structure, the transistor 300 and the transistor 500 can be separated by the barrier layer, so that diffusion of hydrogen from the transistor 300 into the transistor 500 can be inhibited.

Note that for the conductor having a barrier property against hydrogen, tantalum nitride is preferably used, for example. In addition, the use of a stack including tantalum nitride and tungsten, which has high conductivity, can inhibit diffusion of hydrogen from the transistor 300 while the conductivity of a wiring is maintained. In that case, a structure is preferable in which a tantalum nitride layer having a barrier property against hydrogen is in contact with the insulator 350 having a barrier property against hydrogen.

An insulator 360, an insulator 362, and an insulator 370 are sequentially stacked over the insulator 354 and the conductor 356.

For example, like the insulator 324 or the like, the insulator 360 is preferably formed using an insulator having a barrier property against impurities such as water and hydrogen. Thus, the insulator 360 can be formed using any of the materials usable for the insulator 324 or the like, for example.

The insulator 362 has functions of an interlayer insulating film and a planarization film. For example, like the insulator 324, the insulator 362 is preferably formed using an insulator having a barrier property against impurities such as water and hydrogen. Thus, the insulator 362 can be formed using any of the materials usable for the insulator 324.

Like the insulator 324, the insulator 370 is preferably formed using a film having a barrier property that prevents diffusion of impurities such as water and hydrogen, for example. In other words, the insulator 370 is preferably formed using any of the materials usable for the insulator 324. Like the insulator 326, the insulator 370 may be formed using an insulator having a relatively low dielectric constant to reduce the parasitic capacitance generated between wirings, for example. In other words, the insulator 370 may be formed using any of the materials usable for the insulator 326.

An opening portion is provided in regions of the insulator 360, the insulator 362, and the insulator 370 that overlap with part of the conductor 356 and a conductor 366 is embedded to fill the opening portion. The conductor 366 is also formed over the insulator 362. After that, the conductor 366 is patterned into a form of a wiring, a terminal, a pad, or the like by etching treatment or the like.

For example, copper, aluminum, tin, zinc, tungsten, silver, platinum, gold, or the like can be used for the conductor 366. The material used for the conductor 366 preferably contains the same component as the material used for a later-described conductor 406 included in the layer OSL.

After that, planarization treatment is performed by a chemical mechanical polishing (CMP) method or the like to improve the planarity of the insulator 370 and the conductor 366. In this manner, the conductor 366 serving as a wiring, a terminal, a pad, or the like can be formed over the die SCD. Note that the conductor 366 in FIG. 10 corresponds to the connection terminal ET of the die SCD of the semiconductor device PSD1 described in the above embodiment.

Structure Example of Layer OSL

Next, a structure example of the layer OSL will be described.

In Fabrication example 1 of semiconductor device described in Embodiment 1, the semiconductor device PSD1 has a structure in which the layer OSL is formed over the die SCD. Specifically, the connection terminal ET included in the die SCD and the wiring included in the layer OSL are electrically connected to each other. Thus, the conductor 406 corresponding to the wiring, the terminal, the pad, or the like of the die SCD is formed over the conductor 366 of the die SCD. In addition, an insulator 402 for separating the plurality of wirings, terminals, pads, or the like of the die SCD is formed over the insulator 370 of the die SCD.

In addition, planarization treatment is preferably performed on the conductor 406 and the insulator 402 by a chemical mechanical polishing method or the like to improve the planarity of the conductor 406 and the insulator 402.

For the conductor 406, any of the materials usable for the conductor 366 can be used, for example. As described above, a material similar to that for the conductor 366 is preferably used for the conductor 406.

For the insulator 402, any of the materials usable for the insulator 370 can be used, for example.

In FIG. 10, an insulator 410, an insulator 412, and an insulator 414 are sequentially stacked over the insulator 402 and the conductor 406.

Like the insulator 324, the insulator 410 is preferably formed using a film having a barrier property that prevents impurities such as water and hydrogen from diffusing into the region where the transistor 500 is formed. In other words, any of the materials usable for the insulator 324 is preferably used for the insulator 410. This can separate the die SCD and the transistor 500 by a barrier layer, thereby inhibiting hydrogen diffusion from the die SCD into the transistor 500.

Like the insulator 326, the insulator 412 and the insulator 414 are each preferably formed using, for example, an insulator having a relatively low dielectric constant to reduce the parasitic capacitance generated between wirings. In other words, for the insulator 412 and the insulator 414, any of the materials usable for the insulator 326 is preferably used, for example.

A wiring layer may be provided in the insulator 410, the insulator 412, and the insulator 414. For example, in FIG. 10, a conductor 416 functioning as a wiring is embedded in the insulator 410, the insulator 412, and the insulator 414. At this time, the conductor 416 functions as a wiring connecting a conductor 497 described later, the transistor 300, the transistor 500, and the like. Thus, the conductor 416 is formed to be in contact with the conductor 406. For the conductor 416, any of the materials usable for the conductor 328, the conductor 330, and the like can be used, for example.

Furthermore, a wiring layer may be provided over the insulator 414 and the conductor 416. For example, in FIG. 10, an insulator 420, an insulator 422, and an insulator 424 are sequentially stacked over the insulator 414 and the conductor 416. Furthermore, a conductor 426 is formed in the insulator 420, the insulator 422, and the insulator 424. The conductor 426 functions as a plug or a wiring connecting the conductor 497 described later, the transistor 300, the transistor 500, and the like. Thus, the conductor 426 is formed to be in contact with the conductor 416. Note that the conductor 426 can be provided using a material similar to those for the conductor 328 and the conductor 330.

Like the insulator 324, the insulator 420 is preferably formed using an insulator having a barrier property against impurities such as water and hydrogen. The insulator 422 and the insulator 424 are each preferably formed using an insulator having a relatively low dielectric constant to reduce the parasitic capacitance generated between wirings, like the insulator 326. Furthermore, like the conductor 356, the conductor 426 preferably includes a conductor having a barrier property against impurities such as water and hydrogen. In this case, the conductor having a barrier property against impurities such as water and hydrogen is formed in an opening of the insulator 420 having a barrier property against impurities such as water and hydrogen.

Furthermore, a wiring layer may be provided over the insulator 424 and the conductor 426. For example, in FIG. 10, an insulator 430, an insulator 432, and an insulator 434 are sequentially stacked over the insulator 424 and the conductor 426. Furthermore, a conductor 436 is formed in the insulator 430, the insulator 432, and the insulator 434. The conductor 436 functions as a plug or a wiring connecting the conductor 497 described later, the transistor 300, the transistor 500, and the like. Thus, the conductor 436 is formed to be in contact with the conductor 426. Note that the conductor 436 can be provided using a material similar to those for the conductor 328 and the conductor 330.

Like the insulator 324 and the insulator 420, the insulator 430 is preferably formed using an insulator having a barrier property against impurities such as water and hydrogen. Like the insulator 326, the insulator 432 and the insulator 434 are each preferably formed using an insulator having a relatively low dielectric constant to reduce the parasitic capacitance generated between wirings. Like the conductor 356, and the conductor 426, the conductor 436 preferably includes a conductor having a barrier property against impurities such as water and hydrogen.

An insulator 510, an insulator 512, an insulator 513, an insulator 514, and an insulator 516 are sequentially stacked over the insulator 434 and the conductor 436. A substance having a barrier property against oxygen or hydrogen is preferably used for any of the insulator 510, the insulator 512, the insulator 513, the insulator 514, and the insulator 516.

For example, for the insulator 510 and the insulator 514, it is preferable to use a film having a barrier property that prevents diffusion of impurities such as water and hydrogen from the substrate 310 or the like into the region where the transistor 500 is provided. Thus, a material similar to that for the insulator 324 or the like can be used.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the substrate 310. The film that inhibits hydrogen diffusion is specifically a film from which a small amount of hydrogen is released.

For the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents the passage of both oxygen and impurities such as hydrogen and moisture, which are factors of a change in electrical characteristics of the transistor. Accordingly, aluminum oxide can prevent entry of impurities such as hydrogen and moisture into the transistor 500 in the fabrication process and after fabricating of the transistor. In addition, release of oxygen from the oxide included in the transistor 500 can be inhibited. Therefore, aluminum oxide is suitably used for the protective film for the transistor 500.

In addition, the insulator 513 is preferably formed using a film having a barrier property that prevents diffusion of impurities such as water and hydrogen, like the insulator 510 and the insulator 514. In particular, in FIG. 10, the insulator 513 functions as a film sealing the transistor 500 with an insulator 576 described later. Thus, the insulator 513 is preferably formed using any of the materials usable for the insulator 576. Alternatively, the insulator 513 may be formed using any of the materials usable for the insulator 510 or the insulator 514.

In addition, for the insulator 512 and the insulator 516, a material similar to that for the insulator 320 or the insulator 326 can be used, for example. Furthermore, when a material with a relatively low permittivity is used for these insulators, parasitic capacitance generated between wirings can be reduced. A silicon oxide film, a silicon oxynitride film, or the like can be used for the insulator 512 and the insulator 516, for example.

Furthermore, a conductor 518, a conductor included in the transistor 500 (e.g., a conductor 503 illustrated in FIG. 11A and FIG. 11B), and the like are embedded in the insulator 510, the insulator 512, the insulator 513, the insulator 514, and the insulator 516. The conductor 518 has a function of a plug or a wiring connecting the later-described conductor 497, the transistor 300, and the like. The conductor 518 can be provided using a material similar to those for the conductor 328 and the conductor 330, for example.

In particular, the conductor 518 in a region in contact with the insulator 510 and the insulator 514 is preferably a conductor having a barrier property against oxygen, hydrogen, and water. With this structure, the transistor 300 and the transistor 500 can be separated by the layer having a barrier property against oxygen, hydrogen, and water; hence, hydrogen diffusion from the die SCD into the transistor 500 can be inhibited.

The transistor 500 is provided above the insulator 516.

As illustrated in FIG. 11A and FIG. 11B, the transistor 500 includes the conductor 503 placed to be embedded in the insulator 514 and the insulator 516; an insulator 520 placed over the insulator 516 and the conductor 503; an insulator 522 placed over the insulator 520; an insulator 524 placed over the insulator 522; an oxide 530a placed over the insulator 524; an oxide 530b placed over the oxide 530a; a conductor 542a and a conductor 542b placed apart from each other over the oxide 530b; an insulator 580 that is placed over the conductor 542a and the conductor 542b and is provided with an opening formed to overlap with a region between the conductor 542a and the conductor 542b; an oxide 530c placed on a bottom and a side surface of the opening; an insulator 550 placed on a formation surface of the oxide 530c; and a conductor 560 placed on a formation surface of the insulator 550. Note that the conductor 542a and the conductor 542b are collectively referred to as a conductor 542 in this specification and the like.

As illustrated in FIG. 11A and FIG. 11B, an insulator 544 is preferably placed between the insulator 580 and each of the oxide 530a, the oxide 530b, the conductor 542a, and the conductor 542b. In addition, as illustrated in FIG. 11A and FIG. 11B, the conductor 560 preferably includes a conductor 560a provided on the inner side of the insulator 550 and a conductor 560b provided to be embedded on the inner side of the conductor 560a. As illustrated in FIG. 11A and FIG. 11B, an insulator 574 is preferably placed over the insulator 580, the conductor 560, and the insulator 550.

Note that in the following description, the oxide 530a, the oxide 530b, and the oxide 530c are sometimes collectively referred to as an oxide 530.

The transistor 500 is illustrated to have a structure in which the three layers of the oxide 530a, the oxide 530b, and the oxide 530c are stacked in the region where the channel is formed and in the vicinity thereof; however, one embodiment of the present invention is not limited thereto. For example, a single layer of the oxide 530b, a two-layer structure of the oxide 530b and the oxide 530a, a two-layer structure of the oxide 530b and the oxide 530c, or a stacked-layer structure of four or more layers may be employed. Furthermore, although the conductor 560 is illustrated to have a stacked-layer structure of two layers in the transistor 500, one embodiment of the present invention is not limited thereto. For example, the conductor 560 may have a single-layer structure or a stacked-layer structure of three or more layers. Note that the transistor 500 illustrated in FIG. 10, FIG. 11A, and FIG. 11B is an example, and the structure is not limited thereto; an appropriate transistor can be used in accordance with a circuit structure or a driving method.

Here, the conductor 560 functions as a gate electrode of the transistor, and the conductor 542a and the conductor 542b each function as a source electrode or a drain electrode. As described above, the conductor 560 is formed to be embedded in the opening of the insulator 580 and the region between the conductor 542a and the conductor 542b. The positions of the conductor 560, the conductor 542a, and the conductor 542b with respect to the opening of the insulator 580 are selected in a self-aligned manner. That is, in the transistor 500, the gate electrode can be positioned between the source electrode and the drain electrode in a self-aligned manner. Thus, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not include a region overlapping with the conductor 542a or the conductor 542b. Thus, parasitic capacitance formed between the conductor 560 and each of the conductor 542a and the conductor 542b can be reduced. As a result, the transistor 500 can have improved switching speed and high frequency characteristics.

The conductor 560 sometimes functions as a first gate (also referred to as top gate) electrode. In addition, the conductor 503 sometimes functions as a second gate (also referred to as bottom gate) electrode. In that case, the threshold voltage of the transistor 500 can be controlled by changing a potential applied to the conductor 503 not in synchronization with but independently of a potential applied to the conductor 560. In particular, the threshold voltage of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is placed to overlap with the oxide 530 and the conductor 560. Thus, in the case where potentials are applied to the conductor 560 and the conductor 503, an electric field generated from the conductor 560 and an electric field generated from the conductor 503 are connected, so that a channel formation region formed in the oxide 530 can be covered. In this specification and the like, a transistor structure in which a channel formation region is electrically surrounded by electric fields of a first gate electrode and a second gate electrode is referred to as a surrounded channel (S-channel) structure.

In addition, the conductor 503 has a structure similar to that of the conductor 518; a conductor 503a is formed in contact with an inner wall of an opening of the insulator 514 and the insulator 516, and a conductor 503b is formed on the inner side. Although the transistor 500 is illustrated to have a structure in which the conductor 503a and the conductor 503b are stacked, one embodiment of the present invention is not limited thereto. For example, the conductor 503 may be provided as a single layer or to have a stacked-layer structure of three or more layers.

Here, for the conductor 503a, it is preferable to use a conductive material that has a function of inhibiting diffusion of impurities such as a hydrogen atom, a hydrogen molecule, a water molecule, and a copper atom (through which the impurities are less likely to pass). Alternatively, it is preferable to use a conductive material that has a function of inhibiting diffusion of oxygen (e.g., at least one of an oxygen atom, an oxygen molecule, and the like) (through which the oxygen is less likely to pass). Note that in this specification, a function of inhibiting diffusion of impurities or oxygen means a function of inhibiting diffusion of any one or all of the impurities and the oxygen.

For example, when the conductor 503a has a function of inhibiting diffusion of oxygen, a reduction in conductivity of the conductor 503b due to oxidation can be inhibited.

In the case where the conductor 503 also functions as a wiring, a conductive material with high conductivity that contains tungsten, copper, or aluminum as its main component is preferably used for the conductor 503b. In the case where the conductivity of the wiring can be kept high, the conductor 503a is not necessarily provided. Note that the conductor 503b is illustrated as a single layer but may have a stacked-layer structure, for example, a stack of titanium or titanium nitride and any of the above conductive materials.

The insulator 520, the insulator 522, and the insulator 524 have a function of a second gate insulating film.

Here, as the insulator 524 that is in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved. Note that in this specification and the like, an oxygen vacancy in a metal oxide is sometimes referred to as Vo.

A transistor using a metal oxide is likely to change its electrical characteristics when impurities or oxygen vacancies (Vo) exist in a region of the metal oxide where a channel is formed, which might degrade the reliability. In some cases, hydrogen in the vicinity of an oxygen vacancy (Vo) forms a defect that is an oxygen vacancy (Vo) into which hydrogen enters (hereinafter sometimes referred to as VoH), which generates an electron serving as a carrier. Therefore, when the region of the oxide semiconductor where a channel is formed includes oxygen vacancies, the transistor tends to have normally-on characteristics (characteristics with which, even when no voltage is applied to the gate electrode, the channel exists and current flows through the transistor). Thus, impurities, oxygen vacancies, and VoH are preferably reduced as much as possible in the region of the oxide semiconductor where a channel is formed. In other words, it is preferable that the region of the oxide semiconductor where a channel is formed have a reduced carrier concentration and be of an i-type (intrinsic) or substantially i-type.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably within the range of 100° C. to 700° C., or 100° C. to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of VoH is cut occurs, i.e., a reaction of "VoH→Vo+H" occurs. Part of hydrogen generated at this time is bonded to oxygen to be H$_2$O, and removed from the oxide 530 or an insulator near the oxide 530 in some cases. Part of hydrogen is diffused into or gettered (also referred to as gettering) by the conductor 542$a$ and the conductor 542$b$ in some cases.

For the microwave treatment, for example, an apparatus including a power source that generates high-density plasma or an apparatus including a power source that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ratio (O$_2$/(O$_2$+Ar)) is lower than or equal to 50%, preferably higher than or equal to 10% and lower than or equal to 30%.

In a manufacturing process of the transistor 500, heat treatment is preferably performed with the surface of the oxide 530 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies (Vo). The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the oxide 530 can promote a reaction in which oxygen vacancies in the oxide 530 are filled with supplied oxygen, i.e., a reaction of "Vo+O→null". Furthermore, hydrogen remaining in the oxide 530 reacts with supplied oxygen, so that the hydrogen can be removed as H$_2$O (dehydration). This can inhibit recombination of hydrogen remaining in the oxide 530 with oxygen vacancies and formation of VoH.

In the case where the insulator 524 includes an excess-oxygen region, it is preferable that the insulator 522 have a function of inhibiting diffusion of oxygen (e.g., an oxygen atom and an oxygen molecule) (or that the above oxygen be less likely to pass through the insulator 522).

When the insulator 522 has a function of inhibiting diffusion of oxygen, impurities or the like, oxygen contained in the oxide 530 is not diffused to the insulator 520 side, which is preferable. Furthermore, the conductor 503 can be inhibited from reacting with oxygen contained in the insulator 524 and the oxide 530.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate (SrTiO$_3$), or (Ba,Sr)TiO$_3$ (BST) are preferably used, for example. As miniaturization and high integration of transistors progress, a problem such as a leakage current might arise because of a thinner gate insulating film. When a high-k material is used for an insulator functioning as the gate insulating film, a gate potential during transistor operation can be lowered while the physical thickness is maintained.

It is particularly preferable to use an insulator containing an oxide of one or both of aluminum and hafnium, which is an insulating material having a function of inhibiting diffusion of impurities, oxygen, and the like (through which the oxygen is less likely to pass). Aluminum oxide, hafnium oxide, an oxide containing aluminum and hafnium (hafnium aluminate), or the like is preferably used as the insulator containing an oxide of one or both of aluminum and hafnium. In the case where the insulator 522 is formed using such a material, the insulator 522 functions as a layer that inhibits, for example, release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the above insulator.

In addition, it is preferable that the insulator 520 be thermally stable. For example, silicon oxide and silicon oxynitride are suitable because of their thermal stability. Furthermore, when an insulator that is a high-k material is combined with silicon oxide or silicon oxynitride, the insulator 520 having a stacked-layer structure that has thermal stability and a high dielectric constant can be obtained.

In the transistor 500 illustrated in FIG. 11A and FIG. 11B, the second gate insulating film has a stacked-layer structure of three layers including the insulator 520, the insulator 522, and the insulator 524; however, the second gate insulating film may have a single-layer structure, a two-layer structure, or a stacked-layer structure of four or more layers. In that case, the stacked layers are not necessarily formed of the same material and may be formed of different materials.

In the transistor 500, a metal oxide functioning as an oxide semiconductor is preferably used for the oxide 530 including the channel formation region. For example, as the oxide 530, a metal oxide such as an In-M-Zn oxide (the element M is one or more selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, the In-M-Zn oxide that can be used as the oxide 530 is preferably a CAAC-OS (C-Axis Aligned Crystalline Oxide Semiconductor) or a CAC-OS (Cloud-Aligned Composite Oxide Semiconductor). Alternatively, an In—Ga oxide, an In—Zn oxide, an In oxide, or the like may be used as the oxide 530.

Furthermore, a metal oxide with a low carrier concentration is preferably used for the transistor 500. In order to reduce the carrier concentration of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. Examples of impurities in a metal oxide include hydrogen, nitrogen, alkali metal, alkaline earth metal, iron, nickel, and silicon.

In particular, hydrogen contained in a metal oxide reacts with oxygen bonded to a metal atom to be water, and thus forms oxygen vacancies in the metal oxide in some cases. In the case where hydrogen enters an oxygen vacancy in the oxide 530, the oxygen vacancy and the hydrogen are bonded to each other to form VoH in some cases. The VoH serves as a donor and an electron serving as a carrier is generated in some cases. In some cases, bonding of part of hydrogen to oxygen bonded to a metal atom generates electrons serving as carriers. Thus, a transistor using a metal oxide containing a large amount of hydrogen is likely to have normally-on characteristics. Moreover, hydrogen in a metal oxide easily moves by stress such as heat and an electric field; thus, the reliability of a transistor may be low when the metal oxide contains a large amount of hydrogen. In one embodiment of the present invention, VoH in the oxide 530 is preferably reduced as much as possible so that the oxide 530 becomes a highly purified intrinsic or substantially highly purified intrinsic oxide. It is important to remove impurities such as moisture and hydrogen in a metal oxide (sometimes described as dehydration or dehydrogenation treatment) and to compensate for oxygen vacancies by supplying oxygen to the metal oxide (sometimes described as oxygen supplying treatment) to obtain a metal oxide whose VoH is sufficiently reduced. When a metal oxide in which impurities such as VoH are sufficiently reduced is used for a channel formation region of a transistor, stable electrical characteristics can be given.

A defect that is an oxygen vacancy into which hydrogen has entered can function as a donor of a metal oxide. However, it is difficult to evaluate the defects quantitatively. Thus, the metal oxide is sometimes evaluated in terms of not its donor concentration but its carrier concentration. Therefore, in this specification and the like, the carrier concentration assuming the state where an electric field is not applied is sometimes used, instead of the donor concentration, as the parameter of the metal oxide. That is, "carrier concentration" in this specification and the like can be replaced with "donor concentration" in some cases.

Consequently, when a metal oxide is used for the oxide 530, hydrogen in the metal oxide is preferably reduced as much as possible. Specifically, the hydrogen concentration of the metal oxide, which is measured by secondary ion mass spectrometry (SIMS), is lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$. When a metal oxide with a sufficiently low concentration of impurities such as hydrogen is used for a channel formation region of a transistor, stable electrical characteristics can be given.

In the case where a metal oxide is used as the oxide 530, the metal oxide is an intrinsic (also referred to as i-type) or substantially intrinsic semiconductor that has a large band gap, and the carrier concentration of the metal oxide in the channel formation region is preferably lower than $1 \times 10^{18}$ cm$^{-3}$, further preferably lower than $1 \times 10^{17}$ cm$^{-3}$, still further preferably lower than $1 \times 10^{16}$ cm$^{-3}$, yet further preferably lower than $1 \times 10^{13}$ cm$^{-3}$, yet still further preferably lower than $1 \times 10^{12}$ cm$^{-3}$. Note that the lower limit of the carrier concentration of the metal oxide in the channel formation region is not particularly limited and can be, for example, $1 \times 10^{-9}$ cm$^{-3}$.

In the case where a metal oxide is used as the oxide 530, contact between the oxide 530 and each of the conductor 542a and the conductor 542b may diffuse oxygen in the oxide 530 into the conductor 542a and the conductor 542b, resulting in oxidation of the conductor 542a and the conductor 542b in some cases. It is highly possible that oxidation of the conductor 542a and the conductor 542b lowers the conductivity of the conductor 542a and the conductor 542b. Note that diffusion of oxygen in the oxide 530 into the conductor 542a and the conductor 542b can be rephrased as absorption of oxygen in the oxide 530 by the conductor 542a and the conductor 542b.

When oxygen in the oxide 530 diffuses into the conductor 542a and the conductor 542b, a different layer is sometimes formed between the conductor 542a and the oxide 530b and between the conductor 542b and the oxide 530b. The different layer contains a larger amount of oxygen than the conductor 542a and the conductor 542b and thus presumably has an insulating property. In this case, a three-layer structure of the conductor 542a or the conductor 542b, the different layer, and the oxide 530b can be regarded as a three-layer structure of a metal, an insulator, and a semiconductor and is sometimes referred to as a MIS (Metal-Insulator-Semiconductor) structure or referred to as a diode-connected structure mainly formed of the MIS structure.

Note that the different layer is not necessarily formed between the oxide 530b and each of the conductor 542a and the conductor 542b; for example, the different layer is formed between the oxide 530c and each of the conductor 542a and the conductor 542b in some cases.

The metal oxide functioning as the channel formation region in the oxide 530 has a band gap of preferably 2 eV or more, further preferably 2.5 eV or more. The use of a metal oxide having a wide band gap can reduce the off-state current of the transistor.

When the oxide 530 includes the oxide 530a under the oxide 530b, it is possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c.

Note that the oxide 530 preferably has a stacked-layer structure of a plurality of oxide layers that differ in the atomic ratio of metal atoms. Specifically, the atomic ratio of the element M to the constituent elements in the metal oxide used for the oxide 530a is preferably higher than the atomic ratio of the element M to the constituent elements in the metal oxide used for the oxide 530b. The atomic ratio of the element M to In in the metal oxide used for the oxide 530a is preferably higher than the atomic ratio of the element M to In in the metal oxide used for the oxide 530b. The atomic ratio of In to the element Min the metal oxide used for the oxide 530b is preferably higher than the atomic ratio of In to the element M in the metal oxide used for the oxide 530a. Moreover, a metal oxide that can be used as the oxide 530a or the oxide 530b can be used as the oxide 530c.

Specifically, as the oxide 530a, a metal oxide in which an atomic ratio of In to Ga and Zn is In:Ga:Zn=1:3:4 or 1:1:0.5 is used. As the oxide 530b, a metal oxide in which an atomic ratio of In to Ga and Zn is In:Ga:Zn=4:2:3 or 1:1:1 is used. As the oxide 530c, a metal oxide in which an atomic ratio of In to Ga and Zn is In:Ga:Zn=1:3:4 or an atomic ratio of Ga to Zn is Ga:Zn=2:1 or Ga:Zn=2:5 is used. Specific examples of the case where the oxide 530c has a stacked-layer structure include a stacked-layer structure of a layer in which an atomic ratio of In to Ga and Zn is In:Ga:Zn=4:2:3 and a layer with In:Ga:Zn=1:3:4; a stacked-layer structure of a layer in which an atomic ratio of Ga to Zn is Ga:Zn=2:1 and a layer in which an atomic ratio of In to Ga and Zn is In:Ga:Zn=4:2:3; a stacked-layer structure of a layer in which an atomic ratio of Ga to Zn is Ga:Zn=2:5 and a layer in which an atomic ratio of In to Ga and Zn is In:Ga:Zn=4:2:3; and a stacked-layer structure of gallium oxide and a layer in which an atomic ratio of In to Ga and Zn is In:Ga:Zn=4:2:3.

For example, in the case where the atomic ratio of In to the element M in the metal oxide used as the oxide 530a is lower than the atomic ratio of In to the element M in the metal oxide used as the oxide 530b, an In—Ga—Zn oxide having a composition with an atomic ratio of In:Ga:Zn=5:1:6 or a neighborhood thereof, In:Ga:Zn=5:1:3 or a neighborhood thereof, In:Ga:Zn=10:1:3 or a neighborhood thereof, or the like can be used as the oxide 530b.

As the oxide 530b, it is also possible to use a metal oxide having a composition of In:Zn=2:1, a composition of In:Zn=5:1, a composition of In:Zn=10:1, or a composition in the neighborhood of any one of these compositions, other than the above-described compositions.

The oxide 530a, the oxide 530b, and the oxide 530c are preferably combined to satisfy the above relation of the atomic ratios. For example, it is preferable that the oxide 530a and the oxide 530c each be a metal oxide having a composition of In:Ga:Zn=1:3:4 or a composition in the neighborhood thereof and the oxide 530b be a metal oxide having a composition of In:Ga:Zn=4:2:3 to 4:2:4.1 or a composition in the neighborhood thereof. Note that the above composition represents the atomic ratio of an oxide formed over a base or the atomic ratio of a sputtering target. Moreover, it is suitable that the proportion of In is increased in the composition of the oxide 530b because the transistor can have a higher on-state current, higher field-effect mobility, or the like.

In addition, the energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

Here, the energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To change the energy level gradually, the densities of defect states in mixed layers formed at the interface between the oxide 530a and the oxide 530b and the interface between the oxide 530b and the oxide 530c is preferably made low.

Specifically, when the oxide 530a and the oxide 530b or the oxide 530b and the oxide 530c contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used as the oxide 530a and the oxide 530c.

At this time, the oxide 530b serves as a main carrier path. When the oxide 530a and the oxide 530c have the above structures, the densities of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element as its component; an alloy containing any of the above metal elements in combination; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

The conductor 542a and the conductor 542b are illustrated to have a single-layer structure in FIG. 11A and FIG. 11B, but may have a stacked-layer structure of two or more layers. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

In addition, as illustrated in FIG. 11A, a region 543a and a region 543b are sometimes formed as low-resistance regions at an interface between the oxide 530 and the conductor 542a (the conductor 542b) and in the vicinity of the interface. In that case, the region 543a functions as one of a source region and a drain region, and the region 543b functions as the other of the source region and the drain region. Furthermore, the channel formation region is formed in a region interposed between the region 543a and the region 543b.

When the conductor 542a (the conductor 542b) is provided in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier density of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover side surfaces of the oxide 530 and the insulator 524 and to be in contact with the insulator 522.

A metal oxide containing one or more kinds selected from hafnium, aluminum, gallium, yttrium, zirconium, tungsten, titanium, tantalum, nickel, germanium, neodymium, lanthanum, magnesium, and the like can be used as the insulator 544. Alternatively, silicon nitride oxide, silicon nitride, or the like can be used as the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542a and the conductor 542b are oxidation-resistant materials or do not significantly lose their conductivity even after absorbing oxygen. Design is appropriately set in consideration of required transistor characteristics.

When the insulator 544 is included, impurities such as water and hydrogen contained in the insulator 580 can be inhibited from diffusing into the oxide 530b through the oxide 530c and the insulator 550. Furthermore, oxidation of the conductor 560 due to excess oxygen contained in the insulator 580 can be inhibited.

The insulator 550 functions as a first gate insulating film. The insulator 550 is preferably placed in contact with the inner side (the top surface and the side surface) of the oxide 530c. Like the insulator 524, the insulator 550 is preferably formed using an insulator that contains excess oxygen and releases oxygen by heating.

Specifically, it is possible to use any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide, each of which contains excess oxygen. In particular, silicon oxide and silicon oxynitride are preferable because of their thermal stability.

When an insulator from which oxygen is released by heating is provided as the insulator 550 to be in contact with the top surface of the oxide 530c, oxygen can be effectively supplied from the insulator 550 to the channel formation region of the oxide 530b through the oxide 530c. Furthermore, as in the insulator 524, the concentration of impurities such as water or hydrogen in the insulator 550 is preferably lowered. The thickness of the insulator 550 is preferably greater than or equal to 1 nm and less than or equal to 20 nm.

To efficiently supply excess oxygen contained in the insulator 550 to the oxide 530, a metal oxide may be provided between the insulator 550 and the conductor 560. The metal oxide preferably inhibits diffusion of oxygen from the insulator 550 into the conductor 560. Providing the metal oxide inhibiting diffusion of oxygen inhibits diffusion of excess oxygen from the insulator 550 into the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 550 may have a stacked-layer structure like the second gate insulating film. As miniaturization and high integration of transistors progress, a problem such as a leakage current might arise because of a thinner gate insulating film; for that reason, when the insulator functioning as the gate insulating film has a stacked-layer structure of a high-k material and a thermally stable material, a gate potential during transistor operation can be lowered while the physical thickness is kept. Furthermore, the stacked-layer structure can have thermal stability and a high dielectric constant.

The conductor 560 functioning as the first gate electrode is illustrated to have a two-layer structure in FIG. 11A and FIG. 11B, but may have a single-layer structure or a stacked-layer structure of three or more layers.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom and an oxygen molecule). When the conductor 560a has a function of inhibiting diffusion of oxygen, it is possible to inhibit a reduction in conductivity of the conductor 560b due to oxidation caused by oxygen contained in the insulator 550. As a conductive material having a function of inhibiting diffusion of oxygen, for example, tantalum, tantalum nitride, ruthenium, ruthenium oxide, or the like is preferably used. For the conductor 560a, the oxide semiconductor that can be used for the oxide 530 can be used. In that case, when the conductor 560b is formed by a sputtering method, the conductor 560a can have a reduced value of electrical resistance to be a conductor. Such a conductor can be referred to as an OC (Oxide Conductor) electrode.

A conductive material containing tungsten, copper, or aluminum as its main component is preferably used for the conductor 560*b*. Furthermore, the conductor 560*b* also functions as a wiring and thus is preferably formed using a conductor having high conductivity. For example, a conductive material containing tungsten, copper, or aluminum as its main component can be used. Moreover, the conductor 560*b* may have a stacked-layer structure, for example, a stacked-layer structure of titanium or titanium nitride and any of the above conductive materials.

The insulator 580 is provided over the conductor 542*a* and the conductor 542*b* with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride are preferable because of their thermal stability. In particular, silicon oxide and porous silicon oxide are preferable because an excess-oxygen region can be easily formed in a later step.

When the insulator 580 includes an excess-oxygen region, oxygen can be released by heating the insulator 580. Thus, when the insulator 580 from which oxygen is released by heating is provided in contact with the oxide 530*c*, oxygen in the insulator 580 can be efficiently supplied to the oxide 530 through the oxide 530*c*. Note that the concentration of impurities such as water or hydrogen in the insulator 580 is preferably reduced.

The opening of the insulator 580 is formed to overlap with the region between the conductor 542*a* and the conductor 542*b*. Accordingly, the conductor 560 is formed to be embedded in the opening of the insulator 580 and the region between the conductor 542*a* and the conductor 542*b*.

The gate length needs to be small for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with a top surface of the insulator 580, a top surface of the conductor 560, and a top surface of the insulator 550. When the insulator 574 is formed by a sputtering method, excess-oxygen regions can be provided in the insulator 550 and the insulator 580. Accordingly, oxygen can be supplied from the excess-oxygen regions to the oxide 530.

For example, a metal oxide containing one or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

An opening is formed by removing parts of the insulator 574, the insulator 580, the insulator 544, the insulator 522, the insulator 520, the insulator 516, and the insulator 514 to surround the transistor 500 and expose the insulator 513, and then the insulator 576 having a high barrier property against hydrogen or water is formed. Accordingly, side surfaces of the insulator 574, the insulator 580, the insulator 544, the insulator 522, the insulator 520, the insulator 516, and the insulator 514 are each in contact with the insulator 576. This can prevent entry of moisture and hydrogen into the transistor 500 from the outside.

As described above, it is preferable that the insulator 513 and the insulator 576 have higher capability of inhibiting diffusion of hydrogen (e.g., at least one of a hydrogen atom, a hydrogen molecule, and the like) or a water molecule. For example, for the insulator 513 and the insulator 576, silicon nitride or silicon nitride oxide that is a material having a high hydrogen barrier property is preferably used. This can inhibit diffusion of hydrogen or the like into the oxide 530, thereby inhibiting degradation of the characteristics of the transistor 500. Consequently, the reliability of the semiconductor device of one embodiment of the present invention can be increased.

An insulator 581 functioning as an interlayer film and a planarization film is preferably provided over the insulator 576. As in the insulator 524 and the like, the concentration of impurities such as water or hydrogen in the insulator 581 is preferably reduced.

In addition, an insulator 552 is provided on a side surface of an opening formed in the insulator 581, the insulator 576, the insulator 574, the insulator 580, and the insulator 544. Then, a conductor 540*a* and a conductor 540*b* are each provided to be in contact with a side surface of the insulator 552 and a bottom surface of the opening. Note that in FIG. 11A, the conductor 540*a* and the conductor 540*b* are provided to face each other with the conductor 560 therebetween.

The insulator 552 is provided in contact with the insulator 581, the insulator 576, the insulator 574, the insulator 580, and the insulator 544, for example. The insulator 552 preferably has a function of inhibiting diffusion of hydrogen or a water molecule. For example, for the insulator 552, an insulator such as silicon nitride, aluminum oxide, or silicon nitride oxide that is a material having a high hydrogen barrier property is preferably used. In particular, silicon nitride, which is a material having a high hydrogen barrier property, is suitably used for the insulator 552. By using a material having a high hydrogen barrier property for the insulator 552, diffusion of impurities such as water or hydrogen from the insulator 580 or the like into the oxide 530 through the conductor 540*a* and the conductor 540*b* can be inhibited. Furthermore, oxygen contained in the insulator 580 can be inhibited from being absorbed by the conductor 540*a* and the conductor 540*b*. As described above, the reliability of the semiconductor device of one embodiment of the present invention can be increased.

The conductor 540*a* and the conductor 540*b* can be provided using, for example, materials similar to those for the conductor 328, the conductor 330, the conductor 503, and the like. It is particularly preferable that the conductor 540*a* and the conductor 540*b* each have a stacked-layer structure of two or more layers in which the first layer that is in contact with the insulator 552 is formed using a conductive material having a function of inhibiting diffusion of impurities such as a hydrogen atom, a hydrogen molecule, a water molecule, or a copper atom (through which the impurities are less likely to pass) and the second and subsequent layers are formed using a conductive material containing tungsten, copper, aluminum, or the like as its main component and having high conductivity.

In FIG. 10, an insulator 582 is provided over the insulator 581. A substance having a barrier property against oxygen, hydrogen, or the like is preferably used for the insulator 582. Therefore, a material similar to that for the insulator 514 can be used for the insulator 582. For example, a metal oxide such as aluminum oxide, hafnium oxide, or tantalum oxide is preferably used for the insulator 582.

In particular, aluminum oxide has an excellent blocking effect that prevents the passage of both oxygen and impurities such as hydrogen and moisture, which are factors of a change in electrical characteristics of the transistor. Accordingly, aluminum oxide can prevent entry of impurities such as hydrogen and moisture into the transistor 500 in the fabrication process and after fabrication of the transistor. In addition, release of oxygen from the oxide included in the transistor 500 can be inhibited. Therefore, aluminum oxide is suitably used for the protective film of the transistor 500.

An insulator 586 is provided over the insulator 582. For the insulator 586, a material similar to that for the insulator 320 can be used. Furthermore, when a material with a relatively low permittivity is used for these insulators, parasitic capacitance generated between wirings can be reduced. A silicon oxide film, a silicon oxynitride film, or the like can be used as the insulator 586, for example.

As illustrated in FIG. 10 and FIG. 11A, the conductor 540a, the conductor 540b, a conductor 546, and the like are embedded in the insulator 520, the insulator 522, the insulator 524, the insulator 544, the insulator 580, the insulator 574, the insulator 576, the insulator 581, the insulator 582, and the insulator 586. Note that for the conductor 546, any of the materials usable for the conductor 540a and the conductor 540b can be used, for example.

The conductor 540a, the conductor 540b, and the conductor 546 function as plugs or wirings that connect the transistor 500, the transistor 300, and the conductor 497 that is described later. The conductor 540a and the conductor 540b can be provided using materials similar to those for the conductor 328 and the conductor 330. In particular, in FIG. 10, the conductor 546 is formed to be in contact with the conductor 518.

A conductor 450 may be provided over the conductor 540a, the conductor 540b, the conductor 546, and the insulator 586. The conductor 450 functions as a plug that connects the conductor 497 described later, the transistor 300, the transistor 500, and the like. In particular, in FIG. 10, the conductor 450 is formed to be in contact with the conductor 540a, the conductor 540b, the conductor 546, and the like.

For the conductor 450, a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like can be used, for example. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 450 is illustrated to have a single-layer structure in FIG. 10, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

In the layer OSL of the semiconductor device PSD1 in FIG. 10, a wiring layer is provided also above the transistor 500, for example.

An insulator 451, an insulator 452, and an insulator 454 are sequentially stacked over the insulator 586 and the conductor 450.

Like the insulator 324 or the like, the insulator 451 is preferably formed using, for example, a film having a barrier property that prevents diffusion of impurities such as water and hydrogen into the region where the transistor 500 is formed. In other words, the insulator 451 is preferably formed using any of the materials usable for the insulator 324 or the like.

Like the insulator 326, the insulator 452 and the insulator 454 are each preferably formed using an insulator with a relatively low dielectric constant. In other words, the insulator 452 and the insulator 454 are each preferably formed using any of the materials usable for the insulator 326.

Furthermore, a conductor 456 is embedded in the insulator 451, the insulator 452, and the insulator 454. Note that the conductor 456 functions a plug or a wiring that connects the conductor 497 described later, the transistor 300, the transistor 500, and the like. For the conductor 456, any of the materials usable for the conductor 328, the conductor 330, and the like can be used, for example.

In addition, a wiring layer may be provided over the insulator 451, the insulator 452, the insulator 454, and the conductor 456. For example, in FIG. 10, an insulator 460, an insulator 462, and an insulator 464 are sequentially stacked over the insulator 454 and the conductor 456. Furthermore, a conductor 466 is formed in the insulator 460, the insulator 462, and the insulator 464. The conductor 466 functions as a plug or a wiring that connects the conductor 497 described later, the transistor 300, the transistor 500, and the like. Note that the conductor 466 can be provided using a material similar to those for the conductor 328 and the conductor 330.

Like the insulator 324 and the insulator 420, the insulator 460 is preferably formed using an insulator having a barrier property against impurities such as water and hydrogen. Like the insulator 326, the insulator 462 and the insulator 464 are each preferably formed using an insulator having a relatively low dielectric constant to reduce the parasitic capacitance generated between wirings. Like the conductor 356 and the conductor 426, the conductor 466 preferably includes a conductor having a barrier property against impurities such as water and hydrogen, for example. In particular, the conductor having a barrier property against hydrogen is formed in an opening portion of the insulator 460 having a barrier property against impurities such as water and hydrogen. This can separate the transistor 500 from the upper part of the layer OSL by a barrier layer, thereby inhibiting diffusion of impurities such as water and hydrogen from the upper part of the layer OSL into the transistor 500.

An insulator 470 and an insulator 472 are sequentially stacked over the insulator 464 and the conductor 466.

Note that the insulator 470 is preferably formed using an insulator having a barrier property against hydrogen, like the insulator 324 or the like. Thus, the insulator 470 can be formed using any of the materials usable for the insulator 324 or the like, for example.

The insulator 472 functions as a planarization film. Note that the insulator 472 is preferably formed using an insulator having a barrier property against impurities such as water and hydrogen, like the insulator 324. Thus, the insulator 472 can be formed using any of the materials usable for the insulator 324.

A conductor 493 is provided to fill an opening formed in regions of the insulator 470 and the insulator 472 that overlap with part of the conductor 466. The conductor 493 is also formed over the insulator 472. After that, the conductor 493 is patterned into a form of a wiring, a terminal, a pad, or the like by etching treatment or the like.

The conductor 493 can be formed using copper, aluminum, tin, zinc, tungsten, silver, platinum, gold, or the like, for example. In addition, the conductor 493 can be formed using any of the materials usable for the conductor 366 or the conductor 406.

Then, an insulator 492 is formed to cover the insulator 472 and the conductor 493 and is subsequently subjected to planarization treatment by a chemical mechanical polishing (CMP) method or the like until the conductor 493 is exposed. Thus can improve the planarity of the insulator 492 and the conductor 493.

Like the insulator 362, the insulator 492 is preferably provided using an insulator functioning as a planarization film, for example. Thus, the insulator 492 can be formed using any of the materials usable for the insulator 362 or the like, for example.

Then, an insulator 494 and an insulator 495 are sequentially formed over the insulator 492 and the conductor 493. After that, an opening portion is formed in the insulator 494 and the insulator 495 to expose the conductor 493, and a conductor 496 is formed in the opening portion.

Like the insulator 362, the insulator 494 is preferably provided using an insulator functioning as a planarization film, for example. Thus, the insulator 494 can be formed using any of the materials usable for the insulator 362 or the like, for example.

Like the insulator 324 or the like, the insulator 495 is preferably formed using an insulator having a barrier property against impurities such as water and hydrogen, for example. Thus, the insulator 495 can be formed using any of the materials usable for the insulator 324 or the like, for example.

The conductor 496 can be formed using any of the materials usable for the conductor 493, for example. In addition, the conductor 496 is preferably formed using a material that allows the conductor 497 described later to be formed over the conductor 496.

Over the conductor 496, the conductor 497 corresponding to the bump HBL of the semiconductor device PSD1 described in Embodiment 1 is provided, for example. The conductor 497 can be formed using a solder, for example. Alternatively, the conductor 497 can be formed using one selected from Sn, Cu, Ag, Au, Bi, and the like, or an alloy of two or more of them. Note that the conductor 497 is illustrated as a ball-shape bump in FIG. 10, but a bump having a pyramidal shape such as a conical shape or a quadrangular pyramidal shape, a mushroom shape, a columnar shape, or the like may be used. Examples of the method for forming the conductor 497 include an electroplating method, an electroless plating method, and a printing method.

Structure Example 2 of Semiconductor Device

Figure 12:
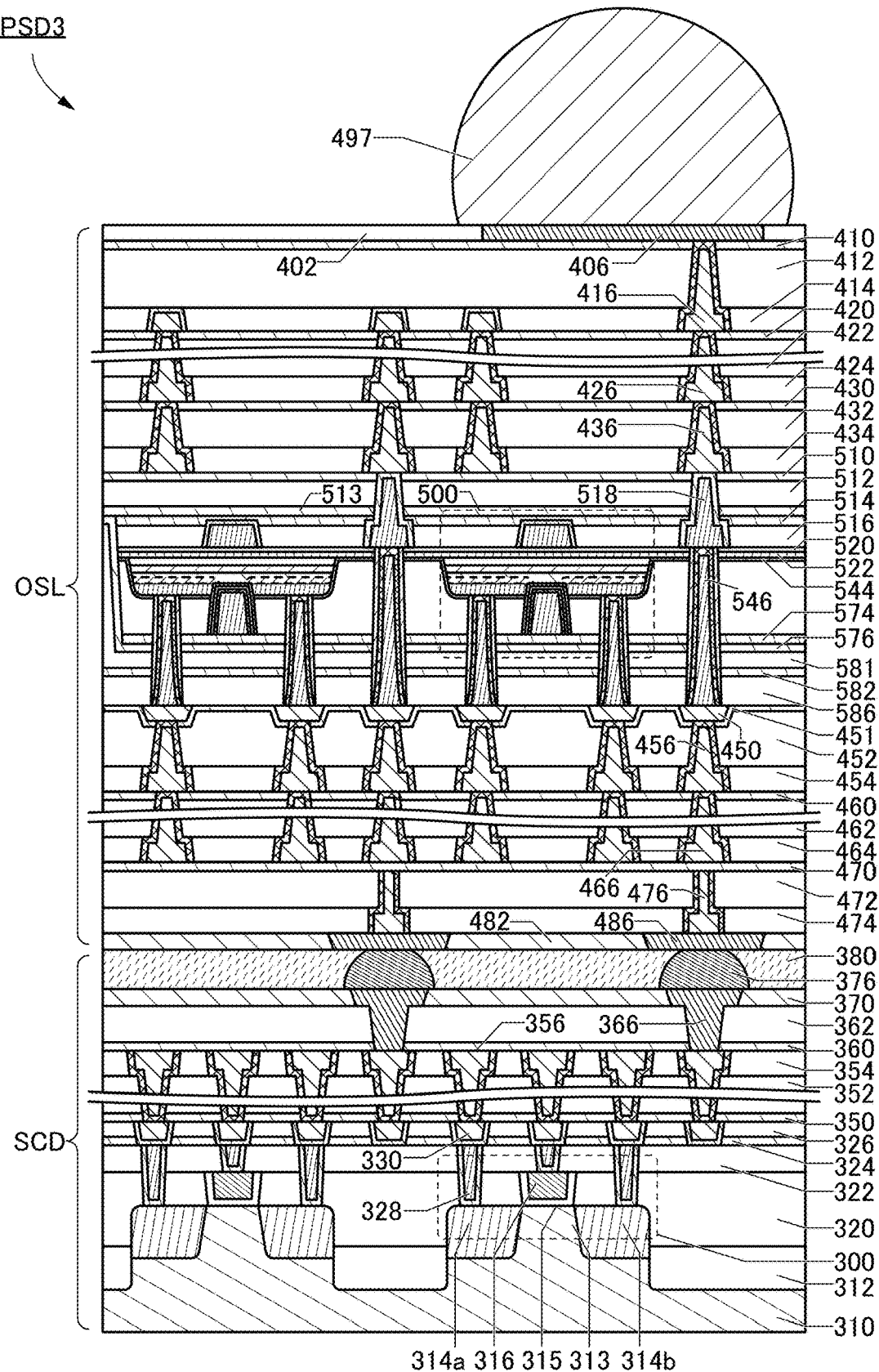
FIG. 12 is a schematic cross-sectional view illustrating a structure example of a semiconductor device.

Next, a structure example of the semiconductor device PSD3 described in Embodiment 1 is described. FIG. 12 is a cross-sectional view schematically illustrating the structure example of the semiconductor device PSD3; the semiconductor device PSD3 includes the transistor 300 and the transistor 500 like the semiconductor device PSD1, for example.

The semiconductor device PSD3 has a structure in which the die SCD is mounted on the layer OSL after formation of the layer OSL; thus, the vertical orientation of the transistor 500 included in the layer OSL is different from the vertical orientation of the transistor 300 included in the die SCD. This is because, in the layer OSL of the semiconductor device PSD3, wirings, insulators, and the like are formed from below the transistor 500, and wirings, terminals, pads, and the like for electrical connection to the die SCD are provided above the transistor 500.

Note that in the semiconductor device PSD3 in FIG. 12, the description of portions common to the above description of the structure example of the semiconductor device PSD1 is omitted.

The layer OSL of the semiconductor device PSD3 is formed in order from the insulator 402 and the conductor 406 to an insulator 482 and a conductor 486 that are described later. For the structure and fabrication method of the insulator 402 and the conductor 406 to the insulator 472, an insulator 474, and a conductor 476 in the layer OSL, the structure example of the layer OSL of the semiconductor device PSD1 is referred to.

The conductor 486 is formed over the insulator 474 and the conductor 476. The conductor 486 corresponds to each of a plurality of wirings, terminals, pads, and the like in the layer OSL for connection to the die SCD. Over the insulator 474, the insulator 482 for separating the plurality of wirings, terminals, pads, and the like in the layer OSL is formed.

The insulator 474 and the conductor 486 are formed in such a manner that, for example, the conductor 486 is formed first, and then the conductor 486 is patterned into a shape of a wiring, a terminal, a pad, or the like by etching treatment or the like. Then, the insulator 482 is formed to cover the insulator 474 and the conductor 486 and is subsequently subjected to planarization treatment by a chemical mechanical polishing (CMP) method or the like until the conductor 486 is exposed. In this manner, the conductor 486 serving as a wiring, a terminal, a pad, or the like can be formed in the layer OSL.

In the die SCD of the semiconductor device PSD3, the transistor 300 is formed on the substrate 310, and the insulator 320, the insulator 332, and the conductor 328 are formed over the transistor 300. Components from the insulator 324, the insulator 326, and the conductor 330 to the insulator 362, the insulator 370, and the conductor 366 are formed over the insulator 320, the insulator 332, and the conductor 328. For the structure and fabrication method of the die SCD of the semiconductor device PSD3, the structure example of the die SCD of the semiconductor device PSD1 described above is referred to.

In the semiconductor device PSD3, the conductor 366 of the die SCD is electrically connected to the conductor 486 of the layer OSL through a conductor 376. The conductor 376 corresponds to the bump BP of the semiconductor device PSD1 described in Embodiment 1. The conductor 376 can be formed using a solder, for example. Alternatively, the conductor 376 can be formed using one selected from Sn, Cu, Ag, Au, Bi, and the like, or an alloy of two or more of them. Note that the conductor 376 is illustrated as a ball-shape bump in FIG. 12, but a bump having a pyramidal shape such as a circular cone shape or a quadrangular pyramidal shape, a mushroom shape, a columnar shape, or the like may be used. Examples of the method for forming the conductor 486 include an electroplating method, an electroless plating method, and a printing method.

In the semiconductor device PSD3, the layer OSL and the die SCD can be bonded to each other by flip-chip bonding, for example. In the semiconductor device PSD3 in FIG. 12, an insulator 380 is injected as an insulating resin between the layer OSL and the die SCD. The insulator 380 corresponds to the insulating resin IJ of the semiconductor device PSD3 described in Embodiment 1.

Although not illustrated in FIG. 10 and FIG. 12, the semiconductor device PSD1 and the semiconductor device PSD3 may each include a capacitor.

Note that this embodiment can be combined with any of the other embodiments in this specification as appropriate.

Embodiment 3

Described in this embodiment is a metal oxide (hereinafter, also referred to as an oxide semiconductor) that can be used in the OS transistor described in the above embodiment.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, the classification of the crystal structures of an oxide semiconductor will be described with reference to FIG. 13A. FIG. 13A is a diagram showing the classification of crystal structures of an oxide semiconductor, typically IGZO (a metal oxide containing In, Ga, and Zn).

As shown in FIG. 13A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (Cloud-Aligned Composite) (excluding single crystal and poly crystal). Note that the term "Crystalline" excludes single crystal, poly crystal, and completely amorphous. The term "Crystal" includes single crystal and poly crystal.

Note that the structures in the thick frame in FIG. 13A are in an intermediate state between "Amorphous" and "Crystal", and belong to a new crystalline phase. That is, these structures are completely different from "Amorphous", which is energetically unstable, and "Crystal".

Note that a crystal structure of a film or a substrate can be evaluated with an X-ray diffraction (XRD) spectrum. FIG. 13B shows an XRD spectrum, which is obtained by GIXD (Grazing-Incidence XRD) measurement, of a CAAC-IGZO film classified into "Crystalline" (the horizontal axis represents 2θ [deg.] and the vertical axis represents intensity in arbitrary unit (a.u.)). Note that a GIXD method is also referred to as a thin film method or a Seemann-Bohlin method. The XRD spectrum that is shown in FIG. 13B and obtained by GIXD measurement is hereinafter simply referred to as an XRD spectrum. The CAAC-IGZO film in FIG. 13B has a composition in the neighborhood of In:Ga:Zn=4:2:3 [atomic ratio]. The CAAC-IGZO film in FIG. 13B has a thickness of 500 nm.

As shown in FIG. 13B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 13B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 13C shows a diffraction pattern of the CAAC-IGZO film. FIG. 13C shows a diffraction pattern obtained by the NBED method in which an electron beam is incident in the direction parallel to the substrate. The composition of the CAAC-IGZO film in FIG. 13C is In:Ga:Zn=4:2:3 [atomic ratio] or the neighborhood thereof. In the nanobeam electron diffraction method, electron diffraction is performed with a probe diameter of 1 nm.

As shown in FIG. 13C, a plurality of spots indicating c-axis alignment are observed in the diffraction pattern of the CAAC-IGZO film.

<<Structure of Oxide Semiconductor>>

Oxide semiconductors might be classified in a manner different from one shown in FIG. 13A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one minute crystal, the maximum diameter of the crystal region is less than 10 nm. In the case where the crystal region is formed of a large number of minute crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (also referred to as grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear crystal grain boundary is observed is what is called polycrystal. It is highly probable that the crystal grain boundary becomes a recombination center and traps carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities, defects (e.g., oxygen vacancies), and the like. Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-like OS]

The a-like OS is an oxide semiconductor having a structure between those of the nc-OS and the amorphous oxide semiconductor. The a-like OS contains a void or a low-density region. That is, the a-like OS has low crystallinity as compared with the nc-OS and the CAAC-OS. Moreover, the a-like OS has a higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. Alternatively, for example, the first region has [In] higher than [In] in the second region and [Ga] lower than [Ga] in the second region. Moreover, the second region has [Ga] higher than [Ga] in the first region and [In] lower than [In] in the first region.

Specifically, the first region includes indium oxide, indium zinc oxide, or the like as its main component. The second region includes gallium oxide, gallium zinc oxide, or the like as its main component. That is, the first region can be rephrased as a region containing In as its main component. The second region can be rephrased as a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, a high on-state current ($I_{on}$), high field-effect mobility ($\mu$), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus also has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon, carbon, or the like which is one of Group 14 elements, is contained in the oxide semiconductor, defect states are formed in the oxide semiconductor. Thus, the concentration of silicon, carbon, or the like in the oxide semiconductor and the concentration of silicon, carbon, or the like in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

Note that this embodiment can be combined with any of the other embodiments described in this specification as appropriate.

Embodiment 4

This embodiment describes a semiconductor wafer, a semiconductor chip obtained by cutting the semiconductor wafer out, a semiconductor device into which the semiconductor chip is incorporated by the FOWLP.

<Semiconductor Wafer and Semiconductor Chip>

First, an example of a semiconductor in which a circuit or the like is formed is described with reference to FIG. 14A.

Figure 14A:
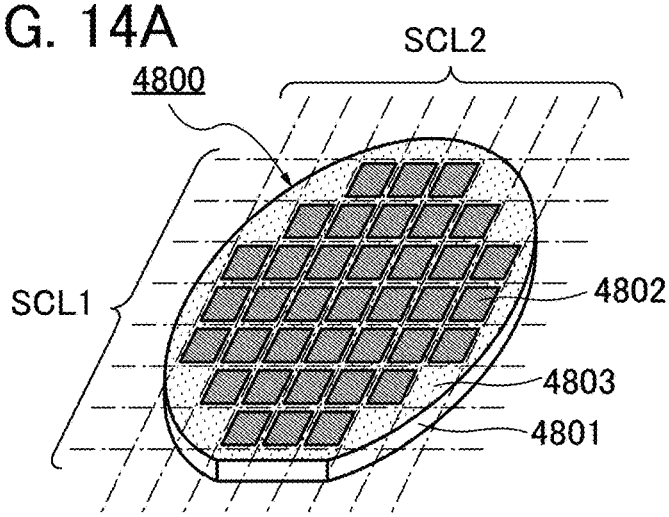
FIG. 14A is a perspective view illustrating an example of a semiconductor wafer.

A semiconductor wafer 4800 illustrated in FIG. 14A includes a wafer 4801 and a plurality of circuit portions 4802 provided on the top surface of the wafer 4801. A portion without the circuit portions 4802 on the top surface of the wafer 4801 is a spacing 4803 that is a region for dicing.

The semiconductor wafer 4800 can be formed by forming the plurality of circuit portions 4802 on the surface of the wafer 4801 by a pre-process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

As the next step, a dicing step is performed. The dicing is performed along scribe lines SCL1 and scribe lines SCL2 (referred to as dicing lines or cutting lines in some cases) indicated by dashed-dotted lines. Note that to perform the dicing step easily, it is preferable that the spacing 4803 be provided so that the plurality of scribe lines SCL1 are parallel to each other, the plurality of scribe lines SCL2 are parallel to each other, and the scribe lines SCL1 are perpendicular to the scribe lines SCL2.

Figure 14B:
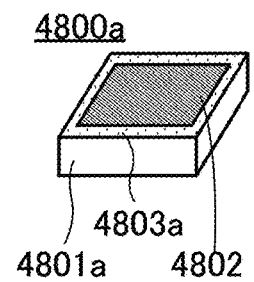
FIG. 14B is a perspective view illustrating an example of a die.

With the dicing step, a semiconductor chip 4800a as illustrated in FIG. 14B can be cut out from the semiconductor wafer 4800. The semiconductor chip 4800a includes a wafer 4801a, the circuit portion 4802, and a spacing 4803a. Note that it is preferable to make the spacing 4803a as small as possible. In this case, the width of the spacing 4803 between adjacent circuit portions 4802 is substantially equal to a cutting allowance of the scribe line SCL1 or a cutting allowance of the scribe line SCL2.

Note that the shape of the element substrate of the semiconductor device of one embodiment of the present invention is not limited to the shape of the semiconductor wafer 4800 illustrated in FIG. 14A. The element substrate may be a rectangular semiconductor wafer, for example. The shape of the element substrate can be changed as appropriate, depending on a fabrication process of an element and an apparatus for fabricating the element.

<Semiconductor Device>

Figure 14C:
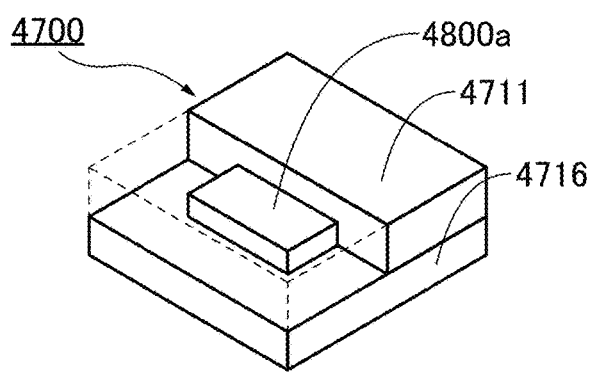
FIG. 14C and FIG. 14D are perspective views illustrating an example of a semiconductor device.

FIG. 14C shows a perspective view of a semiconductor device 4700. In the semiconductor device 4700 illustrated in FIG. 14C, the semiconductor chip 4800a is mounted on a redistribution layer 4716 and a sealant 4711 is provided above the redistribution layer 4716 to cover the semiconductor chip 4800a. Note that FIG. 14C does not illustrate part of the sealant 4711 to illustrate the inside of the semiconductor device 4700.

Figure 14D:
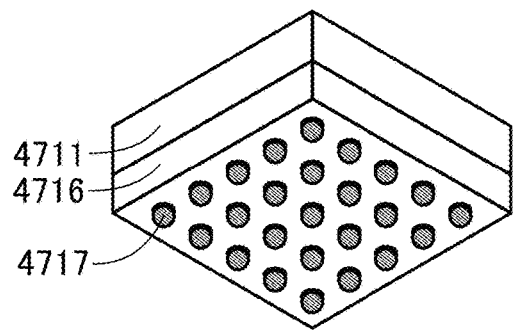

FIG. 14D is a perspective view of the bottom surface side of the semiconductor device 4700. The bottom surface of the semiconductor device 4700 is provided with a BGA (Ball grid array) formed by bumps 4717, for example. Note that the semiconductor device 4700 may include an LGA, a PGA, or the like, without limitation to the BGA.

The semiconductor device 4700 may be mounted on another substrate by a variety of mounting methods not limited to the BGA, the LGA, and the PGA. For example, a mounting method such as an SPGA (Staggered Pin Grid Array), a QFP (Quad Flat Package), a QFJ (Quad Flat J-leaded package), or a QFN (Quad Flat Non-leaded package) may be employed.

In addition, a heat sink (radiator plate) may be provided to overlap with the semiconductor device 4700, the semiconductor chip 4800a, and the like.

As described above, the semiconductor device 4700 can be fabricated by packaging the semiconductor chip 4800a by the FOWLP. Note that the semiconductor device 4700 can be a high bandwidth memory (HBM), for example. Moreover, an integrated circuit (a semiconductor device) such as a CPU, a GPU, an FPGA, or a memory device can be used as the semiconductor device 4700.

Figure 14E:
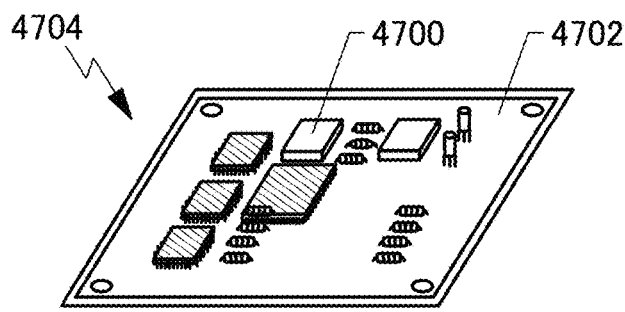
FIG. 14E is a perspective view illustrating an example of a circuit board.

By mounting the semiconductor device 4700 on a printed circuit board or the like, a circuit board such as a main board or a system board included in an electronic device or the like can be formed. FIG. 14E is a perspective view illustrating a substrate (a circuit board 4704) on which the semiconductor device 4700 is mounted, for example. In FIG. 14E, the semiconductor device 4700 is mounted on a printed circuit board 4702, for example. A plurality of semiconductor devices are combined and electrically connected to each other on the printed circuit board 4702 in this manner, whereby the circuit board 4704 is completed.

Note that this embodiment can be combined with any of the other embodiments in this specification as appropriate.

Embodiment 5

Figure 15:
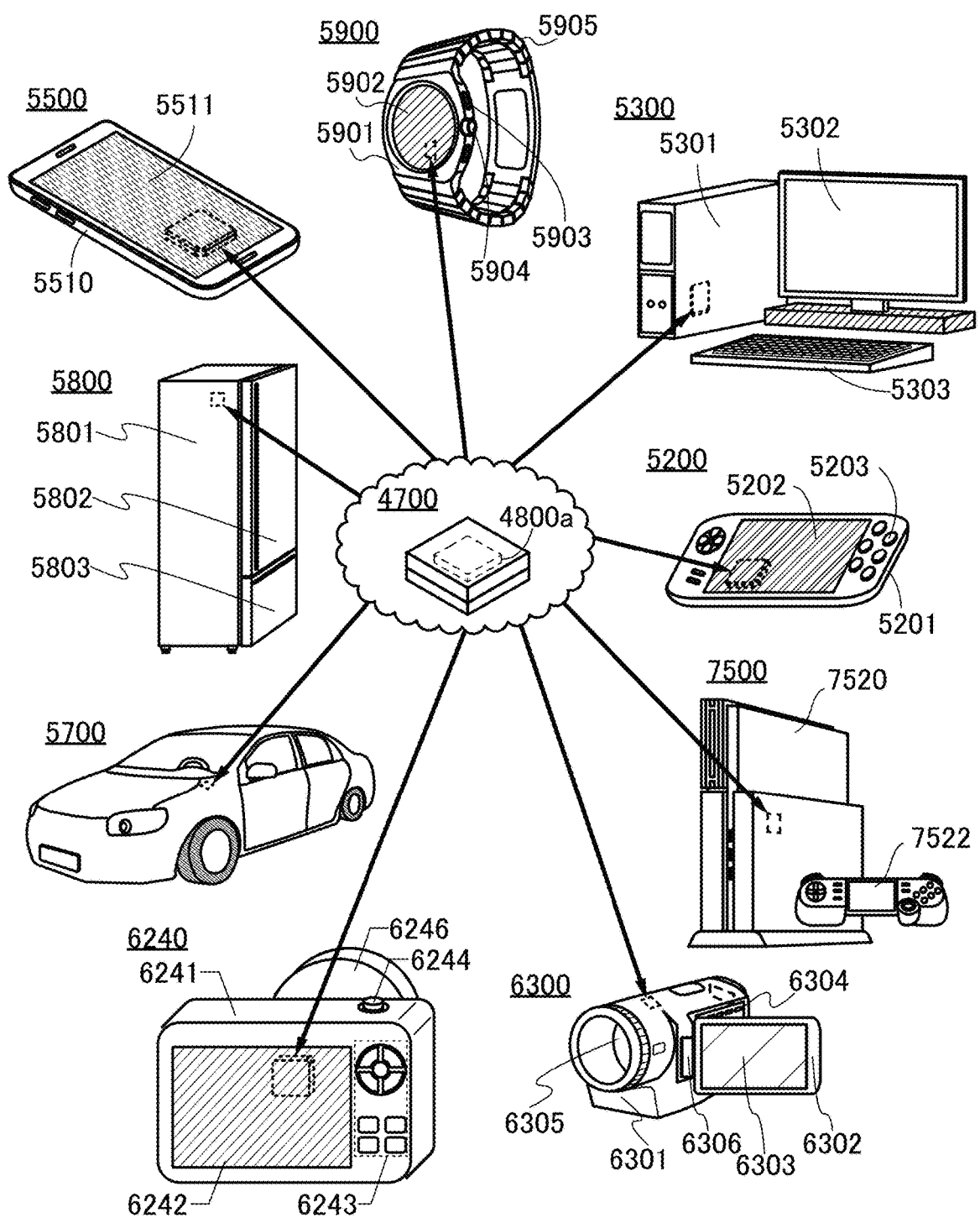
FIG. 15 is a perspective view illustrating examples of electronic devices.

In this embodiment, examples of electronic devices each including the semiconductor device described in the above embodiment are described. FIG. 15 illustrates electronic devices each including the semiconductor device 4700, for example.

[Mobile Phone]

An information terminal 5500 illustrated in FIG. 15 is a mobile phone (smartphone), which is a type of information terminal. The information terminal 5500 includes a housing 5510 and a display portion 5511. As input interfaces, a touch panel and a button are provided in the display portion 5511 and the housing 5510, respectively.

Although not illustrated in FIG. 15, the information terminal 5500 includes a semiconductor device such as a memory device, an imaging device, or a display apparatus. Here, when the information terminal 5500 employs the semiconductor device 4700 including a CML circuit in its redistribution layer, high-speed signal transmission can be performed between a circuit included in the semiconductor device 4700 and an external circuit of the semiconductor device 4700. Thus, the processing speed of the information terminal 5500 can be increased.

[Wearable Terminal]

FIG. 15 illustrates a watch-type information terminal 5900 as an example of a wearable terminal. The information terminal 5900 includes a housing 5901, a display portion 5902, an operation button 5903, an operator 5904, a band 5905, and the like.

Like the information terminal 5500 described above, the wearable terminal can have higher processing speed by employing the semiconductor device 4700 including a CML circuit in its redistribution layer.

[Information Terminal]

FIG. 15 illustrates a desktop information terminal 5300. The desktop information terminal 5300 includes a main body 5301 of the information terminal, a display 5302, and a keyboard 5303.

Like the information terminal 5500 described above, the desktop information terminal 5300 employs the semiconductor device described in the above embodiment, whereby power consumption of the semiconductor device included in the desktop information terminal 5300 can be reduced.

Note that although FIG. 15 illustrates the smartphone, the desktop information terminal, and the wearable terminal as examples of electronic devices, one embodiment of the present invention can also be applied to information terminals other than smartphones, desktop information terminals, and wearable terminals. Examples of information terminals other than smartphones, desktop information terminals, and wearable terminals include a PDA (Personal Digital Assistant), a laptop information terminal, and a workstation.

[Household Appliance]

FIG. 15 illustrates an electric refrigerator-freezer 5800 as an example of a household appliance. The electric refrigerator-freezer 5800 includes a housing 5801, a refrigerator door 5802, a freezer door 5803, and the like.

The electric refrigerator-freezer 5800 may be provided with a communication device so as to be connected to a network. That is, the electric refrigerator-freezer 5800 may be an electronic device compatible with IoT (Internet of Things). When the electric refrigerator-freezer 5800 employs the semiconductor device 4700 including a CML circuit in its redistribution layer, the electric refrigerator-freezer 5800 can perform higher-speed processing related to IoT.

Here, an electric refrigerator-freezer is described as an example of a household appliance; other examples of household appliances include a vacuum cleaner, a microwave oven, an electric oven, a rice cooker, a water heater, an IH (Induction Heating) cooker, a water server, a heating-cooling combination appliance such as an air conditioner, a washing machine, a drying machine, and an audio visual appliance.

[Game Machine]

FIG. 15 illustrates a portable game machine 5200 that is an example of a game machine. The portable game machine 5200 includes a housing 5201, a display unit 5202, a button 5203, and the like.

FIG. 15 illustrates a stationary game machine 7500 that is another example of a game machine. The stationary game machine 7500 includes a main body 7520 and a controller 7522. The controller 7522 can be connected to the main body 7520 with or without a wire. Although not illustrated in FIG. 15, the controller 7522 can include a display portion that displays a game image, and an input interface besides a button, such as a touch panel, a stick, a rotating knob, or a sliding knob, for example. The shape of the controller 7522 is not limited to that illustrated in FIG. 15, and may be changed variously in accordance with the genres of games. For example, in a shooting game such as an FPS (First Person Shooter), a gun-shaped controller having a trigger button can be used. As another example, in a music game or the like, a controller having a shape of a music instrument, audio equipment, or the like can be used. Furthermore, the stationary game machine may include a camera, a depth sensor, a microphone, and the like so that the game player can play a game using a gesture and/or a voice instead of a controller.

Videos displayed on the game machine can be output with a display apparatus such as a television device, a personal computer display, a game display, and a head-mounted display.

When the portable game machine 5200 employs the semiconductor device 4700 including a CML circuit in its redistribution layer, the portable game machine 5200 can have higher processing speed.

Although FIG. 15 illustrates the portable game machine as an example of a game machine, the electronic device of one embodiment of the present invention is not limited thereto. Examples of the electronic device of one embodiment of the present invention include a home stationary game machine, an arcade game machine installed in entertainment facilities (e.g., a game center and an amusement park), and a throwing machine for batting practice installed in sports facilities.

[Moving Vehicle]

The semiconductor device described in the above embodiment can be used in an automobile, which is a moving vehicle, and around the driver's seat in an automobile.

FIG. 15 illustrates an automobile 5700 that is an example of a moving vehicle.

An instrument panel that can display a speedometer, a tachometer, a mileage, a fuel meter, a gearshift state, air-conditioning setting, and the like is provided around the driver's seat in the automobile 5700. In addition, a display apparatus showing the above information may be provided around the driver's seat.

In particular, the display apparatus can compensate for the view obstructed by the pillar or the like, the blind areas for the driver's seat, and the like by displaying a video taken by an imaging device (not illustrated) provided for the automobile 5700, thereby providing a high level of safety. That is, displaying an image taken by the imaging device provided on the exterior of the automobile 5700 can compensate for blind areas and enhance safety.

The semiconductor device described in the above embodiment can be used in the above-described instrument panel and imaging device, for example. In particular, when the CML circuit is provided in the redistribution layer of the semiconductor device, the instrument panel, the imaging device, and the like included in the automobile 5700 can have higher processing speed.

Note that although an automobile is described above as an example of the moving vehicle, the moving vehicle is not limited to an automobile. Examples of moving vehicle also include a train, a monorail train, a ship, and a flying object (a helicopter, an unmanned aircraft (a drone), an airplane, and a rocket), and these moving vehicles can have higher processing speed by employing the semiconductor device of one embodiment of the present invention.

[Camera]

The semiconductor device described in the above embodiment can be used in a camera.

FIG. 15 illustrates a digital camera 6240 that is an example of an imaging device. The digital camera 6240 includes a housing 6241, a display portion 6242, operation buttons 6243, a shutter button 6244, and the like, and a detachable lens 6246 is attached to the digital camera 6240. Here, the lens 6246 of the digital camera 6240 is detachable from the housing 6241 for replacement; alternatively, the lens 6246 may be incorporated into the housing 6241.

Moreover, the digital camera 6240 can be additionally equipped with a stroboscope, a viewfinder, or the like.

When the digital camera 6240 employs the semiconductor device 4700 including a CML circuit in its redistribution layer, the digital camera 6240 can have higher processing speed.

[Video Camera]

The semiconductor device described in the above embodiment can be used in a video camera.

FIG. 15 illustrates a video camera 6300 that is an example of an imaging device. The video camera 6300 includes a first housing 6301, a second housing 6302, a display portion 6303, operation keys 6304, a lens 6305, a joint 6306, and the like. The operation keys 6304 and the lens 6305 are provided in the first housing 6301, and the display portion 6303 is provided in the second housing 6302. The first housing 6301 and the second housing 6302 are connected to each other with the joint 6306, and the angle between the first housing 6301 and the second housing 6302 can be changed with the joint 6306. Videos displayed on the display portion 6303 may be switched in accordance with the angle at the joint 6306 between the first housing 6301 and the second housing 6302.

Like the digital camera 6240 described above, when the video camera 6300 employs the semiconductor device 4700 including a CML circuit in its redistribution layer, the video camera 6300 can have higher processing speed.

Note that this embodiment can be combined with any of the other embodiments in this specification as appropriate.

REFERENCE NUMERALS

PSD: semiconductor device, SCD: die, PR: insulator, OSL: layer, HBL: bump, BSA: substrate, SIL: layer, ET: connection terminal, OTr: transistor, SIC: circuit, OSC: circuit, EXT1: external terminal, EXT2: external terminal, DEV: circuit, RGCM: circuit, HSTC: circuit, CM: differential amplifier circuit, CM1: differential amplifier circuit, CM2: differential amplifier circuit, CM[1]: differential amplifier circuit, CM[2]: differential amplifier circuit, CM[n−1]: differential amplifier circuit, CM[n]: differential amplifier circuit, CM[m]: differential amplifier circuit, CM[n+1]: differential amplifier circuit, CM[m+1]: differential amplifier circuit, CMA: differential amplifier circuit, CMB: differential amplifier circuit, C1P: capacitor, C1N: capacitor, LE1A: load, LE1B: load, LE2P: load, LE2N: load, DTrA: transistor, DTrB: transistor, TrC: transistor, ITrA: transistor, ITrB: transistor, DEA: diode, DEB: diode, CC: current source, VBL1: wiring, VBL2: wiring, VDE: wiring, VSE: wiring, BGE1: wiring, BGE2: wiring, VAL: wiring, OCLN: terminal, OCLP: terminal, HIP: terminal, HIN: terminal, HON: terminal, HOP: terminal, INP: terminal, INN: terminal, OUTP: terminal, OUTN: terminal, PSD1: semiconductor device, PSD2: semiconductor device, PSD3: semiconductor device, PSD4: semiconductor device, BSB: substrate, SB: support, RL: separation layer, BP: bump, IJ: insulating resin, SCL1: scribe line, SCL2: scribe line, 300: transistor, 310: substrate, 312: element isolation layer, 313: semiconductor region, 314*a*: low-resistance region, 314*b*: low-resistance region, 315: insulator, 316: conductor, 320: insulator, 322: insulator, 324: insulator, 326: insulator, 328: conductor, 330: conductor, 332: insulator, 350: insulator, 352: insulator, 354: insulator, 356: conductor, 360: insulator, 362: insulator, 366: conductor, 370: insulator, 376: conductor, 380: insulator, 402: insulator, 406: conductor, 410: insulator, 412: insulator, 414: insulator, 416: conductor, 420: insulator, 422: insulator, 424: insulator, 426: conductor, 430: insulator, 432: insulator, 434: insulator, 436: conductor, 450: conductor, 451: insulator, 452: insulator, 454: insulator, 456: conductor, 460: insulator, 462: insulator, 464: insulator, 466: conductor, 470: insulator, 472: insulator, 474: insulator, 476: conductor, 482: insulator, 486: conductor, 492: insulator, 493: conductor, 494: insulator, 495: insulator, 496: conductor, 497: conductor, 500: transistor, 503: conductor, 503*a*: conductor, 503*b*: conductor, 510: insulator, 512: insulator, 513: insulator, 514: insulator, 516: insulator, 518: conductor, 520: insulator, 522: insulator, 524: insulator, 530: oxide, 530*a*: oxide, 530*b*: oxide, 530*c*: oxide, 540*a*: conductor, 540*b*: conductor, 542: conductor, 542*a*: conductor, 542*b*: conductor, 543*a*: region, 543*b*: region, 544: insulator, 546: conductor, 550: insulator, 552: insulator, 560: conductor, 560*a*: conductor, 560*b*: conductor, 574: insulator, 576: insulator, 580: insulator, 581: insulator, 582: insulator, 586: insulator, 4700: semiconductor device, 4702: printed circuit board, 4704: circuit board, 4711: sealant, 4716: redistribution layer, 4717: bump, 4800: semiconductor wafer, 4800*a*: semiconductor chip, 4801: wafer, 4801*a*: wafer, 4802: circuit portion, 4803: spacing, 4803*a*: spacing, 5200: portable game machine, 5201: housing, 5202: display portion, 5203: button, 5300: desktop information terminal, 5301: main body, 5302: display, 5303: keyboard, 5500: information terminal, 5510: housing, 5511: display portion, 5700: automobile, 5800: electric refrigerator-freezer, 5801: housing, 5802: refrigerator door, 5803: freezer door, 5900: information terminal, 5901: housing, 5902: display portion, 5903: operation button, 5904: operator, 5905: band, 6240: digital camera, 6241: housing, 6242: display portion, 6243: operation button, 6244: shutter button, 6246: lens, 6300: video camera, 6301: housing, 6302: housing, 6303: display portion, 6304: operation key, 6305: lens, 6306: joint, 7500: stationary game machine, 7520: main body, 7522: controller

The invention claimed is:

1. A semiconductor device comprising:

a semiconductor chip comprising a first circuit;

a first external terminal; and a layer comprising a second circuit, wherein the semiconductor chip is provided adjacent to one surface of the layer, wherein the first external terminal is provided adjacent to the other surface of the layer, wherein the first circuit comprises a first transistor and is electrically connected to the second circuit, wherein the second circuit comprises a second transistor and is electrically connected to the first external terminal, wherein a material of a channel formation region of the first transistor is different from a material of a channel formation region of the second transistor, wherein the channel formation region of the second transistor comprises a metal oxide, wherein the metal oxide comprises indium and gallium, and wherein the second circuit is a current mode logic circuit.

2. The semiconductor device according to claim 1, wherein an insulator covers the one surface of the layer and a side surface and a top surface of the semiconductor chip.

3. The semiconductor device according to claim 1, further comprising a second external terminal, wherein the semiconductor chip further comprises a first connection terminal and a second connection terminal, wherein the first circuit is electrically connected to the second circuit through the first connection terminal, and wherein a pitch width between the first external terminal and the second external terminal is larger than a pitch width between the first connection terminal and the second connection terminal.

4. The semiconductor device according to claim 1, wherein the metal oxide further comprises zinc.

5. The semiconductor device according to claim 1, wherein the channel formation region of the first transistor comprises silicon.

6. The semiconductor device according to claim 1, wherein the channel formation region of the first transistor and the channel formation region of the second transistor overlap each other.

7. The semiconductor device according to claim 1, wherein the first transistor and the first external terminal are stacked with the second transistor therebetween.

8. The semiconductor device according to claim 1, wherein the first external terminal comprises a bump.

9. A semiconductor device comprising:

a semiconductor chip comprising a first circuit;

a first external terminal; and a layer comprising a second circuit, wherein the semiconductor chip is provided adjacent to one surface of the layer, wherein the first external terminal is provided adjacent to the other surface of the layer, wherein the first circuit comprises a first transistor and is electrically connected to the second circuit, wherein the second circuit comprises a second transistor and is electrically connected to the first external terminal, wherein a material of a channel formation region of the first transistor is different from a material of a channel formation region of the second transistor, wherein the channel formation region of the second transistor comprises a metal oxide, wherein the metal oxide comprises indium and gallium, and wherein the first external terminal comprises a bump.

* * * * *